United States Patent
Takegami et al.

(10) Patent No.: US 10,386,418 B2
(45) Date of Patent: Aug. 20, 2019

(54) BATTERY STATE ESTIMATION DEVICE

(71) Applicant: MITSUBISHI ELECTRIC CORPORATION, Chiyoda-ku (JP)

(72) Inventors: Tomoki Takegami, Chiyoda-ku (JP); Toshihiro Wada, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 111 days.

(21) Appl. No.: 15/547,109

(22) PCT Filed: Jan. 22, 2016

(86) PCT No.: PCT/JP2016/051822
§ 371 (c)(1),
(2) Date: Jul. 28, 2017

(87) PCT Pub. No.: WO2016/132813
PCT Pub. Date: Aug. 25, 2016

(65) Prior Publication Data
US 2018/0017628 A1    Jan. 18, 2018

(30) Foreign Application Priority Data

Feb. 19, 2015 (JP) .................. 2015-030420

(51) Int. Cl.
*G01R 31/36* (2019.01)
*H01M 10/44* (2006.01)
(Continued)

(52) U.S. Cl.
CPC ....... *G01R 31/3842* (2019.01); *G01R 31/367* (2019.01); *G01R 31/3648* (2013.01);
(Continued)

(58) Field of Classification Search
None
See application file for complete search history.

(56) References Cited

U.S. PATENT DOCUMENTS

2009/0248334 A1* 10/2009 Sans .................... G01R 31/361
702/63
2011/0231124 A1   9/2011 Itabashi
(Continued)

FOREIGN PATENT DOCUMENTS

JP  2006-210244 A   8/2006
JP  2007-250826 A   9/2007
(Continued)

OTHER PUBLICATIONS

International Search Report dated Apr. 19, 2016, in PCT/JP2016/051822, filed Jan. 22, 2016.

*Primary Examiner* — John C Kuan
(74) *Attorney, Agent, or Firm* — Oblon, McClelland, Maier & Neustadt, L.L.P.

(57) ABSTRACT

Provided is a battery state estimation device configured to: calculate a first state of charge and a first open circuit voltage corresponding to the first state of charge by using a detection current output from a current detection unit and state-of-charge estimation parameters; calculate a second open circuit voltage and a second state of charge corresponding to the second open circuit voltage by using a detection voltage output from a voltage detection unit and equivalent circuit parameters; recursively estimate and update the state-of-charge estimation parameters by using a state-of-charge error, which is a value obtained by subtracting the first state of charge from the second state of charge; and recursively estimate and update the equivalent circuit parameters by using an open circuit voltage error, which is a value obtained by subtracting the first open circuit voltage from the second open circuit voltage.

8 Claims, 9 Drawing Sheets

(51) Int. Cl.
*H01M 10/48* (2006.01)
*H01J 7/00* (2006.01)
*G01R 31/367* (2019.01)
*G01R 31/3842* (2019.01)
*G01R 31/392* (2019.01)
*G01R 31/3828* (2019.01)
*G01R 31/382* (2019.01)
*H02J 7/00* (2006.01)

(52) U.S. Cl.
CPC .......... *G01R 31/392* (2019.01); *H01M 10/44* (2013.01); *H02J 7/00* (2013.01); *H02J 7/0047* (2013.01); *G01R 31/382* (2019.01); *G01R 31/3828* (2019.01); *H01M 10/48* (2013.01); *H02J 2007/005* (2013.01)

(56) References Cited

U.S. PATENT DOCUMENTS

| | | | | |
|---|---|---|---|---|
| 2013/0158916 A1* | 6/2013 | Baruzzi | ............. | G01R 31/3624 702/63 |
| 2013/0297243 A1* | 11/2013 | Baba | ................. | B60L 11/1861 702/63 |
| 2014/0149058 A1* | 5/2014 | Moh | ................. | G01R 31/3624 702/63 |
| 2014/0257726 A1 | 9/2014 | Baba et al. | | |
| 2015/0127280 A1 | 5/2015 | Baba et al. | | |
| 2015/0293183 A1* | 10/2015 | Tenmyo | ................ | H01M 10/48 324/429 |
| 2016/0131720 A1* | 5/2016 | Baba | ................... | G01R 31/3651 702/63 |
| 2016/0252585 A1* | 9/2016 | Baba | .................... | H01M 10/48 702/63 |

FOREIGN PATENT DOCUMENTS

| | | |
|---|---|---|
| JP | 2008-52997 A | 3/2008 |
| JP | 2009-142069 A | 6/2009 |
| JP | 2010-157492 A | 7/2010 |
| JP | 4583765 B2 | 11/2010 |
| JP | 2013-208034 A | 10/2013 |
| JP | 5329500 B2 | 10/2013 |
| JP | 2013-238402 A | 11/2013 |
| JP | 5419832 B2 | 2/2014 |
| WO | 2013-052141 A1 | 4/2013 |

* cited by examiner

BATTERY STATE ESTIMATION DEVICE

TECHNICAL FIELD

The present invention relates to a battery state estimation device, which is configured to estimate an internal state of a battery, and more particularly, to a battery state estimation device, which is configured to estimate an internal state of a secondary battery such as a state of charge and a state of health.

BACKGROUND ART

A technology for accurately estimating an internal state of a secondary battery such as a state of charge (SOC) and a state of health (SOH) is important for electric vehicles, railroad vehicles, installed power storage systems, and other systems to use the secondary battery efficiently.

A known example of related art for estimating the SOC is a current integration method for estimating a current SOC by using an initial value of the SOC and an integrated value of a measured current. Further, another known example is an open circuit voltage (OCV) estimation method for estimating the current SOC by estimating an OCV of the battery based on a battery equivalent circuit model and using an OCV-SOC curve.

The current integration method and the OCV estimation method have different characteristics. Specifically, the current integration method can accurately follow short-term change of the SOC, but is susceptible to influences of errors of parameters that are an initial electricity quantity, the SOH, and a current offset. In particular, the error of the current offset is integrated, and as a result, the accuracy of estimating the SOC deteriorates with passage of time.

On the other hand, the OCV estimation method mainly uses a measured voltage to estimate the SOC, and thus the error of each parameter is not accumulated unlike the current integration method. However, it is known that the OCV estimation method is strongly susceptible to influences of errors of equivalent circuit parameters and the measured voltage, and thus the short-term estimation accuracy is poor due to, for example, occurrence of an outlier of the SOC estimation value.

Under such circumstances, there have been proposed numerous SOC estimation methods involving suitably using the current integration method and the OCV estimation method in combination to achieve advantages of both methods while compensating for disadvantages thereof.

A specific example of the SOC estimation method is a technology of calculating a final SOC estimation value by weighting and combining an SOC estimation value estimated with the current integration method and an SOC estimation value estimated with the OCV estimation method depending on usage of the battery (for example, refer to Patent Literature 1).

Further, as described above, the technology for accurately estimating the SOH is also important, and accurate estimation of the SOH enables replacement time of the secondary battery to be grasped appropriately, and achieves improvement of the accuracy of estimating the SOC.

A specific example of the SOH estimation method is a technology of calculating an SOH estimation value (that is, battery capacity estimation value) that is not susceptible to the current integration error by using SOC variation amounts of the current integration method and the OCV estimation method in a period in which a charge/discharge current exceeds a predetermined threshold value (for example, refer to Patent Literature 2).

CITATION LIST

Patent Literature

[PTL 1] JP 4583765 B2
[PTL 2] JP 5419832 B2

Non Patent Literature

[NPL 1] Shuichi Adachi, "Basics of system identification", Tokyo Denki University Press, September 2009, pp. 170-177

SUMMARY OF INVENTION

Technical Problem

However, the related art has the following problems.

In the related art disclosed in Patent Literature 1, the weight for combining two SOCs is determined based on the magnitude of a moving average value of the current. As a result, when the current intensely varies for some period, the error of the current offset significantly influences the final SOC estimation value.

Further, even when the moving average value varies appropriately, as long as an approach of weighting and combining two SOC estimation values is adopted, the errors due to the SOH and the current offset cannot be removed completely for the SOC estimation value estimated with the current integration method.

In the related art disclosed in Patent Literature 2, when the current value does not exceed the threshold value sufficiently long in the integration period, the SOH estimation value is strongly susceptible to the influences of errors of the current integration and the equivalent circuit parameters. Therefore, as long as an approach of improving the accuracy of estimating the SOH by reducing the current integration error is adopted, the influence of the current integration error cannot be removed completely.

The present invention has been made to solve the above-mentioned problems, and has an object to provide a battery state estimation device capable of estimating the internal state of a battery more accurately than the related art.

Solution to Problem

According to one embodiment of the present invention, there is provided a battery state estimation device, which is configure to estimate a state of charge of a secondary battery as an estimated state of charge, the battery state estimation device including: a current detection unit configured to detect one of a charge current and a discharge current of the secondary battery as a detection current to output the detection current; a voltage detection unit configured to detect a voltage between terminals of the secondary battery as a detection voltage to output the detection voltage; a first recursive estimation unit configured to estimate state-of-charge estimation parameters to output the state-of-charge estimation parameters, the state-of-charge estimation parameters including: a state of health of the secondary battery or a full charge capacity of the secondary battery; and an offset current of the current detection unit; an SOC estimation unit configured to calculate elapsed time since estimation of the state of charge of the second battery is started, an integrated electricity quantity measured since the estimation of the state of charge of the second battery is started, and a first state of charge based on the detection current output from the current detection unit and the state-of-charge estimation parameters output from the first recursive estimation unit, to output the elapsed time, the integrated electricity quantity, and the first state of charge; an offset current subtraction unit configured to output, as a correction current, a value obtained by subtracting the offset current output from the first recursive estimation unit from the detection current output from the current detect ion unit; an SOC-OCV conversion unit configured to convert the first state of charge output from the SOC estimation unit into a first open circuit voltage to output the first open circuit voltage; a second recursive estimation unit configured to estimate equivalent circuit parameters to output the equivalent circuit parameters; an OCV estimation unit configured to calculate, based on the correction current output from the offset current subtraction unit, the detection voltage output from the voltage detection unit, and the equivalent circuit parameters output from the second recursive estimation unit, a second open circuit voltage and a state variable of an equivalent circuit corresponding to the equivalent circuit parameters to output the second open circuit voltage and the state variable; an OCV-SOC conversion unit configured to convert the second open circuit voltage output from the OCV estimation unit into a second state of charge to output the second state of charge; an OCV subtraction unit configured to output, as an open circuit voltage error, a value obtained by subtracting the first open circuit voltage output from the SOC-OCV conversion unit from the second open circuit voltage output from the OCV estimation unit; and an SOC subtraction unit configured to output, as a state-of-charge error, a value obtained by subtracting the first state of charge output from the SOC estimation unit from the second state of charge output from the OCV-SOC conversion unit, in which the first recursive estimation unit is configured to recursively estimate and update the state-of-charge estimation parameters based on the state-of-charge error output from the SOC subtraction unit and the elapsed time and the integrated electricity quantity that are output from the SOC estimation unit, in which the second recursive estimation unit is configured to recursively estimate and update the equivalent circuit parameters based on the correction current output from the offset current subtraction unit, the state variable output from the OCV estimation unit, and the open circuit voltage error output from the OCV subtraction unit, and in which the battery state estimation device is configured to determine the first state of charge as the estimated state of charge.

Advantageous Effects of Invention

According to the present invention, it is possible to provide the battery state estimation device capable of estimating the internal state of a battery more accurately than the related art by the battery state estimation device being configured to estimate, in a basic configuration in which the current integration method and the OCV estimation method are used in combination, the SOC of the secondary battery with the new SOC estimation method that involves utilizing feedback information that is based on the estimation result.

DESCRIPTION OF EMBODIMENTS

Now, a battery state estimation device according to preferred embodiments of the present invention is described referring to the accompanying drawings. In the illustration of the drawings, the same components or corresponding components are denoted by the same reference symbols, and the overlapping description thereof is herein omitted. The battery state estimation device according to the present invention is configured to estimate an internal state of a secondary battery, and more specifically, to estimate the internal state of the secondary battery in operation in, for example, electric vehicles, railroad vehicles, installed power storage systems, and other systems.

First Embodiment

Figure 1:
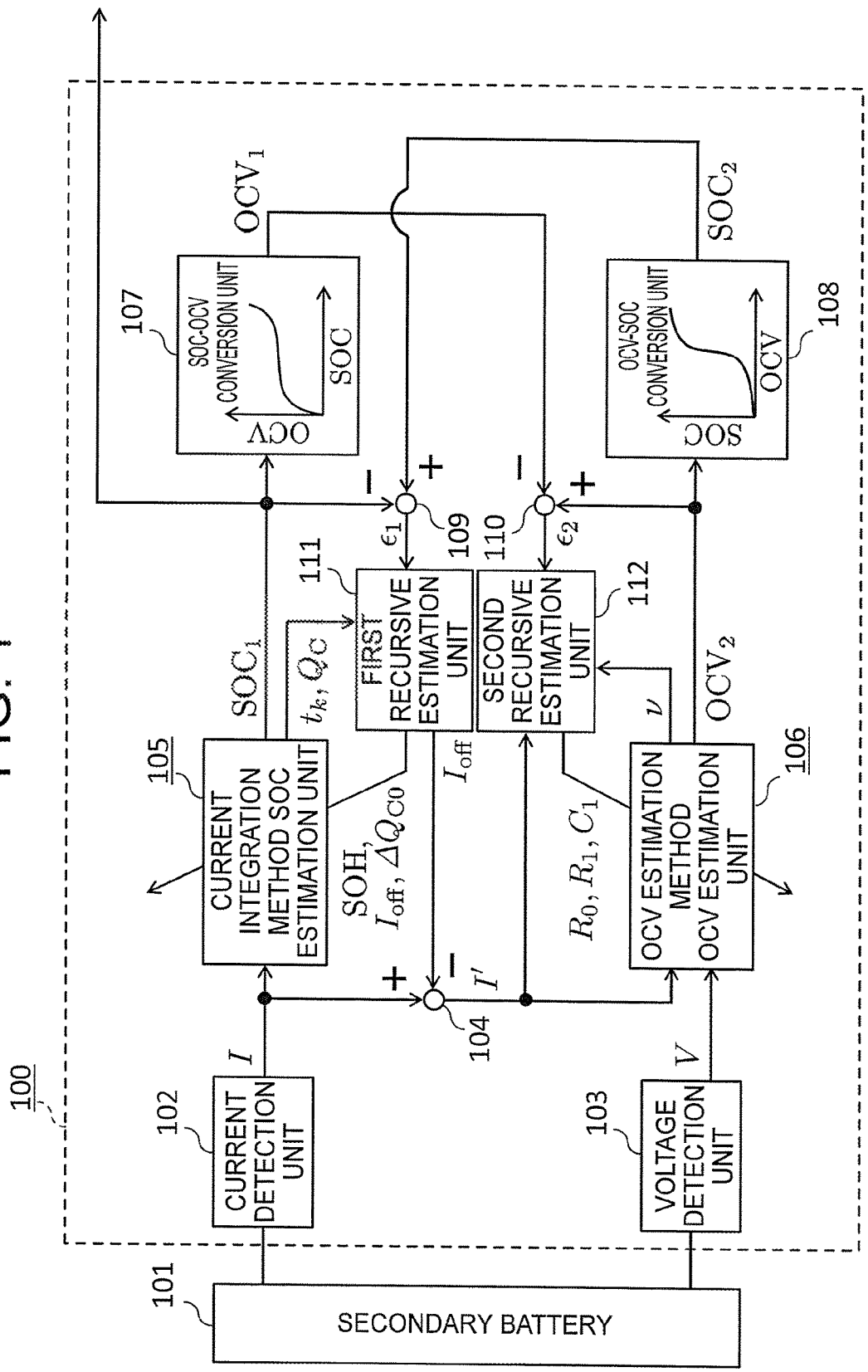
FIG. 1 is a configuration diagram of a battery state estimation device according to a first embodiment of the present invention.

FIG. 1 is a configuration diagram of a battery state estimation device 100 according to a first embodiment of the present invention. In FIG. 1, a secondary battery 101 to be connected to the battery state estimation device 100 is also illustrated.

Now, a description is given of the battery state estimation device 100 based on the assumption that the secondary battery 101 is a lithium-ion battery. The definition of the secondary battery 101 includes chargeable/dischargeable batteries in general, and the secondary battery 101 may be, for example, a lead storage battery, a nickel-hydrogen battery, or an electric double-layer capacitor.

In FIG. 1, the battery state estimation device 100 includes a current detection unit 102, a voltage detection unit 103, an offset current subtraction unit 104, an SOC estimation unit 105, an OCV estimation unit 106, an SOC-OCV conversion unit 107, an OCV-SOC conversion unit 108, an SOC subtraction unit 109, an OCV subtraction unit 110, a first recursive estimation unit 111, and a second recursive estimation unit 112.

The current detection unit 102 is configured to execute current detection processing. Specifically, the current detection unit 102 detects a charge/discharge current of the secondary battery 101 as a detection current I, and outputs the detection current I to the offset current subtraction unit 104 and the SOC estimation unit 105.

The voltage detection unit 103 is configured to execute voltage detection processing. Specifically, the voltage detection unit 103 detects a voltage between terminals at the time of charge/discharge of the secondary battery 101 as a detection voltage V, and outputs the detection voltage V to the OCV estimation unit 106.

The offset current subtraction unit 104 is configured to execute current offset subtraction processing. Specifically, the offset current subtraction unit 104 subtracts an offset current $I_{off}$ input from the first recursive estimation unit 111 from the detection current I input from the current detection unit 102, and outputs the obtained value as a correction current I' to the OCV estimation unit 106 and the second recursive estimation unit 112.

The SOC estimation unit 105 is configured to execute SOC estimation processing with a current integration method. Specifically, the SOC estimation unit 105 uses the current integration method to estimate a first state of charge $SOC_1$. To be more specific, the SOC estimation unit 105 calculates the first state of charge $SOC_1$, an elapsed time $t_k$, and an integrated electricity quantity $Q_C$ based on the detection current I input from the current detection unit 102, a state of health SOH of the secondary battery 101, the offset current $I_{off}$, and an initial electricity quantity error $\Delta Q_{C0}$ of the secondary battery 101, which are input from the first recursive estimation unit 111.

Parameters necessary for calculating the SOC with the current integration method are described as "SOC estimation parameters". In this description, there is given an example of a case in which the SOC estimation parameters are the state of health SOH, the offset current $I_{off}$, and the initial electricity quantity error $\Delta Q_{C0}$.

The SOC estimation unit 105 outputs the calculated first state of charge $SOC_1$ to the SOC-OCV conversion unit 107 and the SOC subtraction unit 109, and outputs the calculated elapsed time $t_k$ and the integrated electricity quantity $Q_C$ to the first recursive estimation unit 111.

Further, the SOC of the secondary battery 101 estimated by the battery state estimation device 100 is the first state of charge $SOC_1$ output from the SOC estimation unit 105. In other words, the first state of charge $SOC_1$ is output as a final result of estimation of the SOC of the secondary battery 101 by the battery state estimation device 100.

Next, a description is given of principles of calculating the first state of charge $SOC_1$ by the SOC estimation unit 105 through use of expressions.

When the SOC of the secondary battery 101 is estimated through use of the current integration method, which is the known art, an SOC estimation value $SOC_C$ can be expressed by Expression (1) or (2) where $SOC_C$ represents the estimation value of the SOC and $Q_C$ represents the integrated electricity quantity.

$$SOC_C(k+1) = SOC_C(k) + \frac{t_s}{FCC} I(k) \quad (1)$$

$$\begin{cases} Q_C(k+1) = Q_C(k) + t_s I(k) \\ SOC_C(k) = \frac{1}{FCC} Q_C(k) \end{cases} \quad (2)$$

In the expressions given above, $t_s$ represents a sampling period, k represents a sampling time, and FCC represents a full charge capacity (FCC). The FCC can be expressed by Expression (3) using an initial full charge capacity $FCC_0$ and the state of health SOH.

$$FCC = FCC_0 \times SOH \quad (3)$$

Next, the true value of the electricity quantity of the secondary battery 101 is represented by Q*, and representation of Q* by the integrated electricity quantity $Q_C$ is discussed.

The detection current I contains the offset current $I_{off}$, which is a constant value, as the detection error of the current detection unit 102. Further, the initial value of the integrated electricity quantity $Q_C$ contains the initial electricity quantity error $\Delta Q_{C0}$ ($=Q_C(0)-Q^*(0)$) measured with respect to Q*. Therefore, it can be considered that Q* is obtained by subtracting the electricity quantity corresponding to the offset current $I_{off}$ and the initial electricity quantity error $\Delta Q_{C0}$ from the integrated electricity quantity $Q_C$. That is, Expression (4) is satisfied.

$$Q^*(k) = Q_C(k) - t_k I_{off} - \Delta Q_{C0} \quad (4)$$

In Expression (4), $t_k = k t_s$ is satisfied, and $t_k$ represents elapsed time from an initial time corresponding to k=0. Specifically, the elapsed time $t_k$ represents elapsed time since estimation of the SOC of the secondary battery 101 is started, and more specifically, represents elapsed time since execution of processing of a flowchart illustrated in FIG. 5 described later is started.

Further, through use of Expressions (3) and (4) to correct the second equations of Expression (2), the first state of charge $SOC_1$ is represented as the following expression.

$$SOC_1(k) = \frac{1}{FCC_0 \cdot SOH} (Q_C(k) - t_k I_{off} - \Delta Q_{C0}) \quad (5)$$

The SOC estimation unit 105 follows Expression (5) to calculate the first state of charge $SOC_1$. As can be understood from Expression (5), when the SOC estimation unit 105 uses the accurately estimated SOC estimation parameters (namely, the state of health SOH, the offset current $I_{off}$, and the initial electricity quantity error $\Delta Q_{C0}$), the SOC estimation unit 105 can calculate an accurate SOC with its error directly removed therefrom.

Figure 2:
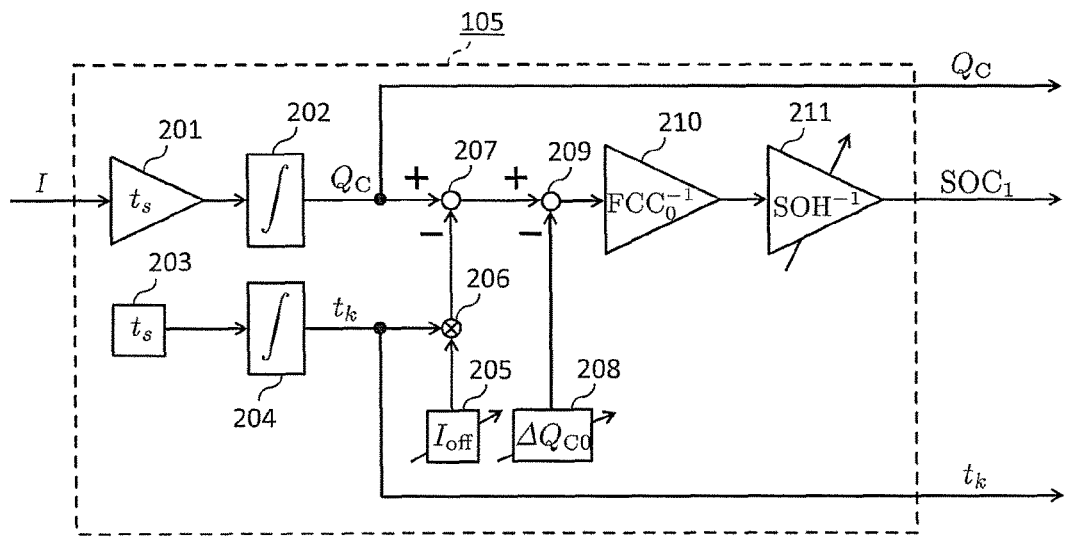
FIG. 2 is a configuration diagram of an SOC estimation unit according to the first embodiment of the present invention.

Next, a description is given of a specific configuration example of the SOC estimation unit 105 with reference to FIG. 2. FIG. 2 is a configuration diagram of the SOC estimation unit 105 according to the first embodiment of the present invention.

In FIG. 2, the SOC estimation unit 105 includes a coefficient multiplier 201, an integrator 202, a value storage unit 203, an integrator 204, a value storage unit 205, a multiplier 206, a subtractor 207, a value storage unit 208, a subtractor 209, a coefficient multiplier 210, and a coefficient multiplier 211.

The coefficient multiplier 201 is configured to execute sampling period multiplication processing. Specifically, the coefficient multiplier 201 multiplies the detection current I input from the current detection unit 102 by the sampling period $t_s$, and outputs the obtained value to the integrator 202.

The integrator 202 is configured to execute integrated electricity quantity calculation processing. Specifically, the integrator 202 adds an output value of the integrator 202 at previous time to an output value of the coefficient multiplier 201 to calculate the integrated electricity quantity $Q_C$, and outputs the calculated integrated electricity quantity $Q_C$. In short, the integrator 202 calculates the first equation of Expression (2). When the SOC estimation is started, the first state of charge $SOC_1$ obtained at the end of the previous SOC estimation may be multiplied by the full charge capacity FCC to be used as the value of $Q_C(0)$.

In other cases, when a long period of time has elapsed since the end of the previous SOC estimation, the overvoltage of the secondary battery 101 is considered to be sufficiently small, and thus the detection voltage V detected by the voltage detection unit 103 may be considered as an open circuit voltage of the secondary battery 101. Therefore, it is possible to use the OCV-SOC conversion unit 108 described later to convert the open circuit voltage into the SOC, and use the value obtained by multiplying the converted SOC by the full charge capacity FCC as the value of $Q_C(0)$.

The value storage unit 203 is configured to execute stored sampling period output processing. Specifically, the value storage unit 203 stores the sampling period $t_s$, and outputs the stored sampling period $t_s$ to the integrator 204.

The integrator 204 is configured to execute elapsed time calculation processing. Specifically, the integrator 204 integrates the output value of the value storage unit 203 (namely, sampling period $t_s$) to calculate the elapsed time $t_k$, and outputs the calculated elapsed time $t_k$. The integrator 204 sets to 0 the initial value of before the output value of the value storage unit 203 is started to be integrated.

The value storage unit 205 is configured to execute stored current offset output processing. Specifically, the value storage unit 205 stores the offset current $I_{off}$, and outputs the stored offset current $I_{off}$ to the multiplier 206.

The multiplier 206 is configured to execute elapsed time multiplication processing. Specifically, the multiplier 206 multiplies the output value of the integrator 204 (namely, elapsed time $t_k$) by the output value of the value storage unit 205 (namely, offset current $I_{off}$), and outputs the obtained value to the subtractor 207.

The subtractor 207 is configured to execute offset subtraction processing. Specifically, the subtractor 207 subtracts the output value of the multiplier 206 from the output value of the integrator 202, and outputs the obtained value to the subtractor 209.

The value storage unit 208 is configured to execute stored initial electricity quantity error output processing. Specifically, the value storage unit 208 stores the initial electricity quantity error $\Delta Q_{C0}$, and outputs the stored initial electricity quantity error $\Delta Q_{C0}$ to the subtractor 209.

The subtractor 209 is configured to execute initial electricity quantity error subtraction processing. Specifically, the subtractor 209 subtracts the output value of the value storage unit 208 from the output value of the subtractor 207, and outputs the obtained value to the coefficient multiplier 210.

The coefficient multiplier 210 is configured to execute initial FCC reciprocal multiplication processing. Specifically, the coefficient multiplier 210 multiplies the output value of the subtractor 209 by the reciprocal of the initial full charge capacity $FCC_0$, and outputs the obtained value to the coefficient multiplier 211. The reciprocal of the initial full charge capacity $FCC_0$ is hereinafter denoted by "reciprocal $FCC_0^{-1}$".

The coefficient multiplier 211 is configured to execute SOH reciprocal multiplication processing. Specifically, the coefficient multiplier 211 multiplies the output value of the coefficient multiplier 210 by the reciprocal of the state of health SOH, and outputs the obtained value as the first state of charge $SOC_1$. The reciprocal of the state of health SOH is hereinafter denoted by "reciprocal $SOH^{-1}$".

Respective values stored in the value storage unit 205 and the value storage unit 208, and the state of health SOH to be used by the coefficient multiplier 211 to calculate the first state of charge $SOC_1$ are recursively updated through use of output from the first recursive estimation unit 111 described later.

Referring back to the description of FIG. 1, the OCV estimation unit 106 is configured to execute OCV estimation processing with an OCV estimation method. Specifically, the OCV estimation unit 106 uses the OCV estimation method to estimate a second open circuit voltage $OCV_2$ of the secondary battery 101. To be more specific, the OCV estimation unit 106 calculates the second open circuit voltage $OCV_2$ and a voltage drop amount v of the secondary battery 101 based on the correction current I' input from the offset current subtraction unit 104, the detection voltage V input from the voltage detection unit 103, and equivalent circuit parameters input from the second recursive estimation unit 112.

The OCV estimation unit 106 outputs the calculated second open circuit voltage $OCV_2$ to the OCV-SOC conversion unit 108 and the OCV subtraction unit 110, and outputs the calculated voltage drop amount v to the second recursive estimation unit 112.

Figure 3:
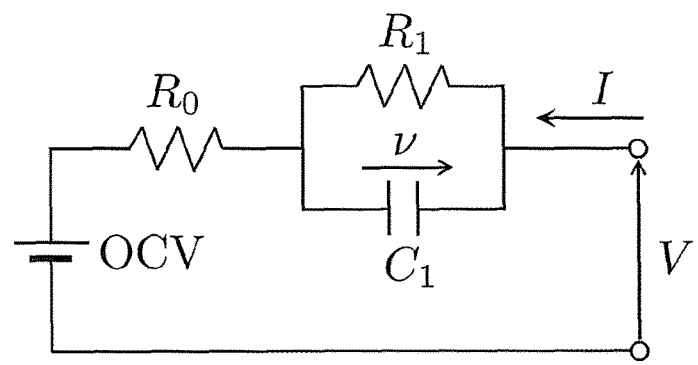
FIG. 3 is a circuit diagram for illustrating a configuration example of an equivalent circuit model of a secondary battery to be applied to an OCV estimation unit according to the first embodiment of the present invention.

Next, a description is given of principles of calculating the second open circuit voltage $OCV_2$ by the OCV estimation unit 106 through use of expressions with reference to FIG. 3. FIG. 3 is a circuit diagram for illustrating a configuration example of an equivalent circuit model of the secondary battery 101 to be applied to the OCV estimation unit 106 according to the first embodiment of the present invention.

The second open circuit voltage $OCV_2$ is obtained by subtracting an overvoltage $\eta$ of the secondary battery 101 from the detection voltage V corresponding to a voltage between terminals of the secondary battery 101. That is, Expression (6) is satisfied.

$$OCV_2(k)=V(k)-\eta(k) \qquad (6)$$

Further, it is possible to approximately calculate the overvoltage $\eta$ through use of the equivalent circuit model of the secondary battery 101.

In FIG. 3, $R_0$ represents a direct current resistance that takes a solution resistance and a charge transfer resistance with a small time constant into consideration. Further, $R_1$ represents a diffusion resistance, and $C_1$ represents an electric double-layer capacitance. In this case, $R_0$, $R_1$, and $C_1$ are the equivalent circuit parameters. Further, the voltage drop amount v is a voltage drop amount measured for the parallel circuit portion of $R_1$ and $C_1$.

Further, assuming the equivalent circuit model illustrated in FIG. 3, the overvoltage $\eta$ of the secondary battery 101 is calculated in accordance with Expression (7) with the voltage drop amount v being a state variable of the equivalent circuit.

$$\begin{cases} v(k+1) = e^{-\frac{t_s}{R_1 C_1}} v(k) + R_1 \left(1 - e^{-\frac{t_s}{R_1 C_1}}\right) I'(k) \\ \eta(k) = R_0 I'(k) + v(k) \end{cases} \quad (7)$$

The first embodiment assumes the equivalent circuit model illustrated in FIG. 3, but the configuration of the equivalent circuit model is not limited to that of FIG. 3. For example, diffusion may be represented by a multistage RC circuit, or the charge transfer resistance may be separated from the direct current resistance when the sampling period $t_s$ is short enough. In this manner, it is possible to adopt various kinds of configurations for the equivalent circuit model of the secondary battery 101.

Further, in this description, there is exemplified a case in which the state variable of the equivalent circuit is the voltage drop amount v, but a charge amount q of a capacitor $C_1$ may be adopted as the state variable of the equivalent circuit instead of the voltage drop amount v.

Figure 4:
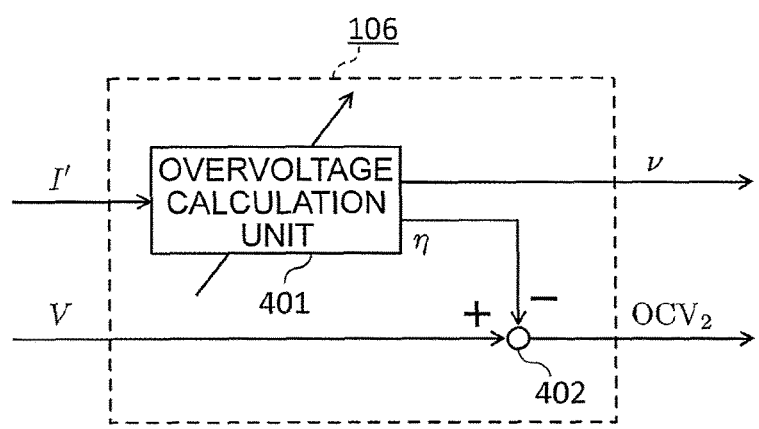
FIG. 4 is a configuration diagram of the OCV estimation unit according to the first embodiment of the present invention.

Next, a description is given of a specific configuration example of the OCV estimation unit 106 with reference to FIG. 4. FIG. 4 is a configuration diagram of the OCV estimation unit 106 according to the first embodiment of the present invention. In FIG. 4, the OCV estimation unit 106 includes an overvoltage calculation unit 401 and a subtractor 402.

The overvoltage calculation unit 401 is configured to execute overvoltage calculation processing. Specifically, the overvoltage calculation unit 401 calculates the voltage drop amount v and the overvoltage η in accordance with Expression (7) based on the correction current I' input from the offset current subtraction unit 104. Further, the overvoltage calculation unit 401 outputs the calculated voltage drop amount v to the second recursive estimation unit 112, and outputs the calculated overvoltage η to the subtractor 402.

The subtractor 402 is configured to execute overvoltage subtraction processing. Specifically, the subtractor 402 subtracts the overvoltage η from the detection voltage V input from the voltage detection unit 103, and outputs the obtained value as the second open circuit voltage $OCV_2$.

The equivalent circuit parameters to be used by the overvoltage calculation unit 401 to calculate the voltage drop amount v and the overvoltage η in accordance with Expression (7) are recursively updated through use of output from the second recursive estimation unit 112 described later.

Referring back to the description of FIG. 1, the SOC-OCV conversion unit 107 is configured to execute SOC-OCV conversion processing. Specifically, the SOC-OCV conversion unit 107 converts the first state of charge $SOC_1$ input from the SOC estimation unit 105 into a first open circuit voltage $OCV_1$ of the secondary battery 101, and outputs the first open circuit voltage $OCV_1$ obtained through conversion to the OCV subtraction unit 110.

The relationship between the SOC and the open circuit voltage hardly depends on the temperature and degradation degree of the secondary battery 101, and thus the SOC-OCV conversion unit 107 converts the open circuit voltage into the SOC based on measurement data acquired in advance. Specifically, for example, the SOC-OCV conversion unit 107 creates a liner interpolation function or an approximation curve based on a limited number of pieces of measurement data, and uses the function or curve to convert the open circuit voltage into the SOC.

The OCV-SOC conversion unit 108 is configured to execute OCV-SOC conversion processing. Specifically, the OCV-SOC conversion unit 108 converts the second open circuit voltage $OCV_2$ input from the OCV estimation unit 106 into a second state of charge $SOC_2$ of the secondary battery 101, and outputs the second state of charge $SOC_2$ obtained through conversion to the SOC subtraction unit 109.

Further, the OCV-SOC conversion unit 108 can use a function similar to that of the SOC-OCV conversion unit 107 to convert the second open circuit voltage $OCV_2$ input from the OCV estimation unit 106 into the second state of charge $SOC_2$.

The SOC subtraction unit 109 is configured to execute SOC error calculation processing. Specifically, the SOC subtraction unit 109 subtracts the first state of charge $SOC_1$ input from the SOC estimation unit 105 from the second state of charge $SOC_2$ input from the OCV-SOC conversion unit 108, and outputs the obtained value to the first recursive estimation unit 111 as an SOC error $\varepsilon_1$.

The OCV subtraction unit 110 is configured to execute OCV error calculation processing. Specifically, the OCV subtraction unit 110 subtracts the first open circuit voltage $OCV_1$ input from the SOC-OCV conversion unit 107 from the second open circuit voltage $OCV_2$ input from the OCV estimation unit 106, and outputs the obtained value to the second recursive estimation unit 112 as an open circuit voltage error $\varepsilon_2$.

The first recursive estimation unit 111 is configured to execute recursive estimation processing for current integration correction to recursively update estimation values of the SOC estimation parameters. Specifically, the first recursive estimation unit 111 uses a recursive estimation method based on the elapsed time $t_k$ and the integrated electricity quantity $Q_C$ that are input from the SOC estimation unit 105 and the SOC error $\varepsilon_1$ input from the SOC subtraction unit 109, to thereby calculate the estimation values of the SOC estimation parameters. Further, the first recursive estimation unit 111 outputs the calculated SOC estimation parameters to the SOC estimation unit 105, and outputs only the offset current $I_{off}$ to the offset current subtraction unit 104 among the calculated SOC estimation parameters.

The recursive estimation method to be used by the first recursive estimation unit 111 may be, for example, recursive least squares (RLS) (for example, refer to Non Patent Literature 1).

The recursive estimation method is not limited to RLS, and may be, for example, recursive total least squares (RTLS), recursive partial least squares (RPLS), or a Kalman filter.

The update formula for RLS is constructed as given below in Expression (8).

$$\theta_1(k) = \theta_1(k-1) + \frac{P_1(k-1)\phi_1(k)}{\lambda_1 + \phi_1^T(k)P_1(k-1)\phi_1(k)} \varepsilon_1(k) \quad (8)$$

$$P_1(k) = \frac{1}{\lambda_1}\left\{P_1(k-1) - \frac{P_1(k-1)\phi_1(k)\phi_1^T(k)P_1(k-1)}{\lambda_1 + \phi_1^T(k)P_1(k-1)\phi_1(k)}\right\}$$

In Expression (8), when N represents the number of independent variables, $\theta_1$, $\varphi_1$, $P_1$, $\varepsilon_1$, and $\lambda_1$ represent an N×1 independent variable vector, an N×1 vector, an N×N covariance matrix, an error signal, and a forgetting coefficient, respectively.

Further, $\varphi_1$ and $\theta_1$ may be set by, for example, Expression (9) given below.

$$\phi_1(k) = [Q_C(k)/FCC_0 - t_k/FCC_0 - 1]^T$$

$$\theta_1(k)=[1/SOH(k) \; I_{off}(k)/SOH(k) \; \Delta Q_{C0}(k)/(FCC_0 \cdot SOH(k))]^T \quad (9)$$

On the basis of Expression (5), representation of $SOC_1(k)=\varphi_1^T(k)\theta_1(k-1)$ is obtained. Thus, it can be understood that the SOC error $\varepsilon_1$, which is an output value of the SOC subtraction unit 109, has the second state of charge $SOC_2$ as its teaching signal, and serves as a predication error of RLS.

$\theta_1(k)$ obtained by the first equation of Expression (8) is used to solve the second equation of Expression (9), and as a result, the estimation values of the SOC estimation parameters, namely, SOH(k), $I_{off}(k)$, and $\Delta Q_{C0}(k)$ are obtained.

The initial value $\theta_1(0)$ of the independent variable vector may be determined by using preliminary information on SOH(0), $I_{off}(0)$, and $\Delta Q_{C0}(0)$, or when there is no preliminary information, SOH(0)=1, $I_{off}(0)$=0, and $\Delta Q_{C0}(0)$=0 may be set, for example.

In this description, there is exemplified a case in which the SOC estimation parameters are the state of health SOH, the offset current $I_{off}$, and the initial electricity quantity error $\Delta Q_{C0}$. However, the SOC estimation parameters are not limited to those values.

Specifically, in this description, there is exemplified a case in which the state of health SOH is given as one error factor as shown in Expression (5) to estimate the state of health SOH. However, the full charge capacity FCC may be given as one error factor instead of the state of health SOH to estimate the full charge capacity FCC.

Further, in this description, there is exemplified a case in which the initial electricity quantity error $\Delta Q_{C0}$ is given as one error factor of the current integration method to estimate the initial electricity quantity error $\Delta Q_{C0}$. However, an initial electricity quantity $Q_{C0}$ may be given as one error factor of the current integration method instead of the initial electricity quantity error $\Delta Q_{C0}$ to estimate the initial electricity quantity $Q_{C0}$.

Further, in this description, there is exemplified a case in which the initial electricity quantity error $\Delta Q_{C0}$ is given as one error factor of the current integration method to estimate the initial electricity quantity error $\Delta Q_{C0}$. However, an initial state of charge $SOC_{ini}$ may be given as one error factor of the current integration method instead of the initial electricity quantity error $\Delta Q_{C0}$ to estimate the initial state of charge $SOC_{ini}$.

Further, in this description, there is exemplified a case in which the initial electricity quantity error $\Delta Q_{C0}$ is given as one error factor of the current integration method to estimate the initial electricity quantity error $\Delta Q_{C0}$. However, an initial SOC error $\Delta SOC_{ini}$ may be given as one error factor of the current integration method instead of the initial electricity quantity error $\Delta Q_{C0}$ to estimate the initial SOC error $\Delta SOC_{ini}$.

To give a specific example, when the full charge capacity FCC is estimated instead of the state of health SOH and the initial state of charge $SOC_{ini}$ is estimated instead of the initial electricity quantity error $\Delta Q_{C0}$, the first state of charge $SOC_1$ is calculated in accordance with Expression (10) that replaces Expression (5).

$$SOC_1(k) = \frac{1}{FCC}(Q_C(k) - t_k I_{off}) + SOC_{ini} \quad (10)$$

Further, when the initial electricity quantity error $\Delta Q_{C0}$ is sufficiently small, only the state of health SOH and the offset current $I_{off}$ may be estimated without estimating the initial electricity quantity error $\Delta Q_{C0}$.

In this manner, it is possible to estimate the first state of charge $SOC_1$ as long as the SOC estimation parameters at least include the state of health SOH and the offset current $I_{off}$ among the state of health SOH, the full charge capacity FCC, the offset current $I_{off}$, the initial electricity quantity $Q_{C0}$, the initial electricity quantity error $\Delta Q_{C0}$, the initial state of charge $SOC_{ini}$, and the initial SOC error $\Delta SOC_{ini}$.

In other cases, it is also possible to estimate the first state of charge $SOC_1$ as long as the SOC estimation parameters at least include the full charge capacity FCC and the offset current $I_{off}$ among the state of health SOH, the full charge capacity FCC, the offset current $I_{off}$, the initial electricity quantity $Q_{C0}$, the initial electricity quantity error $\Delta Q_{C0}$, the initial state of charge $SOC_{ini}$, and the initial SOC error $\Delta SOC_{ini}$.

The second recursive estimation unit 112 is configured to execute recursive estimation processing for equivalent circuit correction to recursively update estimation values of the equivalent circuit parameters. Specifically, the second recursive estimation unit 112 uses a recursive estimation method based on the correction current I' input from the offset current subtraction unit 104, the voltage drop amount v input from the OCV estimation unit 106, and the open circuit voltage error $\varepsilon_2$ input from the OCV subtraction unit 110, to thereby calculate the estimation values of the equivalent circuit parameters. Further, the second recursive estimation unit 112 outputs the calculated equivalent circuit parameters to the OCV estimation unit 106.

The recursive estimation method to be used by the second recursive estimation unit 112 is, for example, RLS similarly to the case of the first recursive estimation unit 111. In this case, the update formula for RLS is constructed as given below in Expression (11).

$$\theta_2(k) = \theta_2(k-1) + \frac{P_2(k-1)\phi_2(k)}{\lambda_2 + \phi_2^T(k)P_2(k-1)\phi_2(k)}\varepsilon_2(k) \quad (11)$$

$$P_2(k) = \frac{1}{\lambda_2}\left\{P_2(k-1) - \frac{P_2(k-1)\phi_2(k)\phi_2^T(k)P_2(k-1)}{\lambda_2 + \phi_2^T(k)P_2(k-1)\phi_2(k)}\right\}$$

In Expression (11), when N represents the number of independent variables, $\theta_2$, $\varphi_2$, $P_2$, $\varepsilon_2$, and $\lambda_2$ represent an N×1 independent variable vector, an N×1 vector, an N×N covariance matrix, an error signal, and a forgetting coefficient, respectively.

Further, $\varphi_2$ and $\theta_2$ may be set by, for example, Expression (12) given below.

$$\phi_2(k) = [\, I'(k) \quad v(k) \quad I'(k-1)\,]^T \quad (12)$$

$$\theta_2(k) = \left[\, R_0(k) \quad e^{-\frac{t_s}{R_1(k)C_1(k)}} \quad R_1(k)\left(1 - e^{-\frac{t_s}{R_1(k)C_1(k)}}\right)\,\right]^T$$

In this case, Expression (13) is satisfied based on Expressions (6) and (7).

$$\varepsilon_2(k) = OCV_2(k) - OCV_1(k) \quad (13)$$

$$= V(k) - OCV_1(k) - \eta(k)$$

$$= V(k) - OCV_1(k) - R_0(k-1)I'(k) - e^{-\frac{t_s}{R_1(k-1)C_1(k-1)}}v(k-1) -$$

-continued $$R_1(k-1)\left(1 - e^{-\frac{t_s}{R_1(k-1)C_1(k-1)}}\right)I'(k-1)$$
$$= V(k) - OCV_1(k) - \phi_2^T(k)\theta_2(k-1)$$

As can be understood from Expression (13), the open circuit voltage error $\varepsilon_2$, which is an output value of the OCV subtraction unit 110, has (V-OCV$_1$) as its teaching signal, and serves as a predication error of RLS.

$\theta_2(k)$ obtained by the first equation of Expression (11) is used to solve the second equation of Expression (12), and as a result, the estimation values of the equivalent circuit parameters, namely, $R_0(k)$, $R_1(k)$, and $C_1(k)$ are obtained.

The initial value $\theta_2(0)$ of the independent variable vector may be determined by holding, for example, map data on each parameter for each battery temperature as preliminary information on $R_0(0)$, $R_1(0)$, and $C_1(0)$, and inputting the battery temperature of the secondary battery 101.

As can be understood from Expression (12), the second recursive estimation unit 112 is configured to estimate all the equivalent circuit parameters, but the second recursive estimation unit 112 may be configured to estimate only $R_0$ and $R_1$ among the equivalent circuit parameters by fixing a part thereof, for example, a time constant $\tau$ (=$C_1R_1$) of the equivalent circuit.

In this case, for example, map data for each temperature or degradation degree of the secondary battery 101 is used to determine the value of the time constant $\tau$. Further, Expression (14) given below is considered instead of Expression (7).

$$\begin{cases} q(k+1) = e^{-\frac{t_s}{\tau}}q(k) + \tau\left(1 - e^{-\frac{t_s}{\tau}}\right)I'(k) \\ \eta(k) = R_0 I'(k) + \frac{R_1}{\tau}q(k) \end{cases} \quad (14)$$

In this manner, when Expression (14) is considered, Expression (15) given below is used instead of Expression (12). In this case, the charge amount q of the capacitor $C_1$ is the state variable of the equivalent circuit instead of the voltage drop amount v.

$$\phi_2(k) = [I'(k)q(k)/\tau]^T$$
$$\theta_2(k) = [R_0(k)R_1(k)]^T \quad (15)$$

Figure 5:
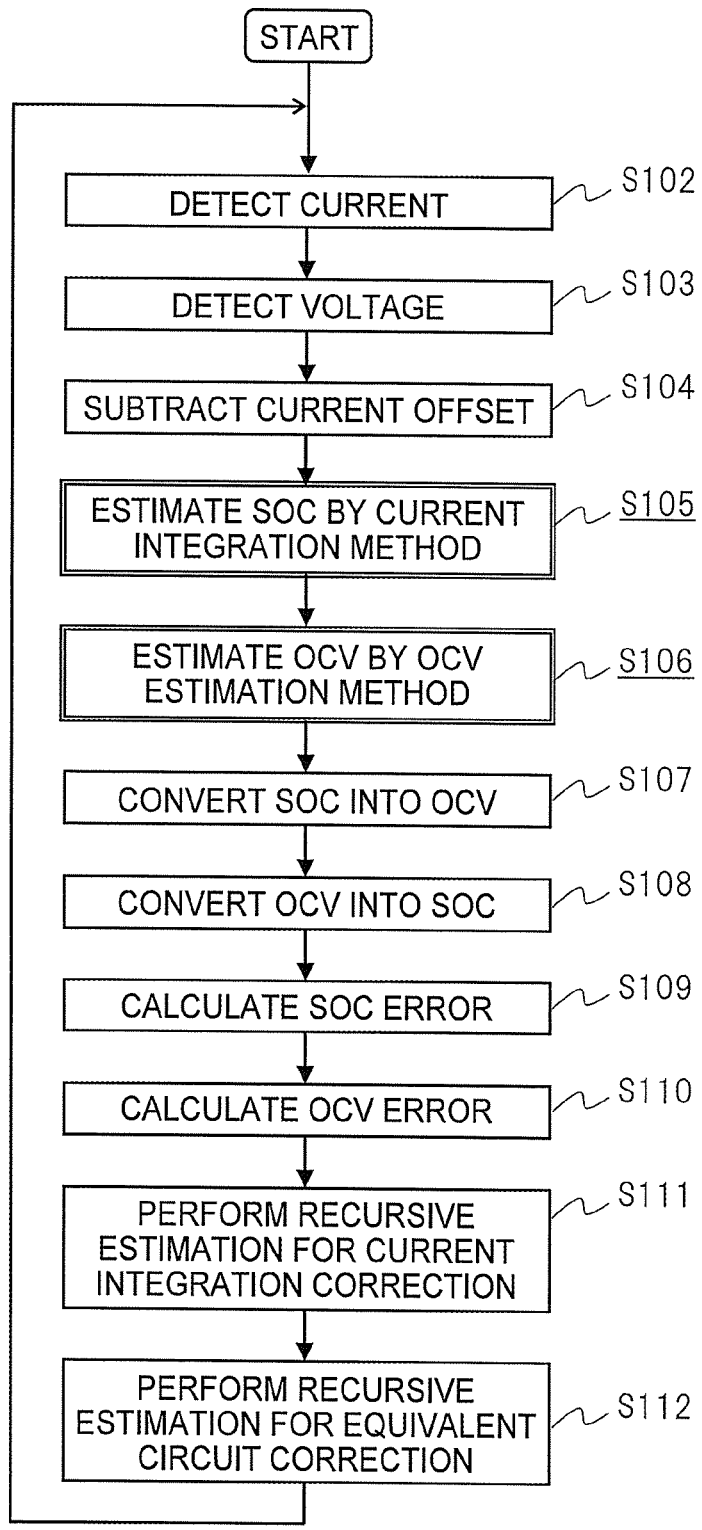
FIG. 5 is a flowchart for illustrating a series of operations to be executed by the battery state estimation device according to the first embodiment of the present invention.
Figure 6:
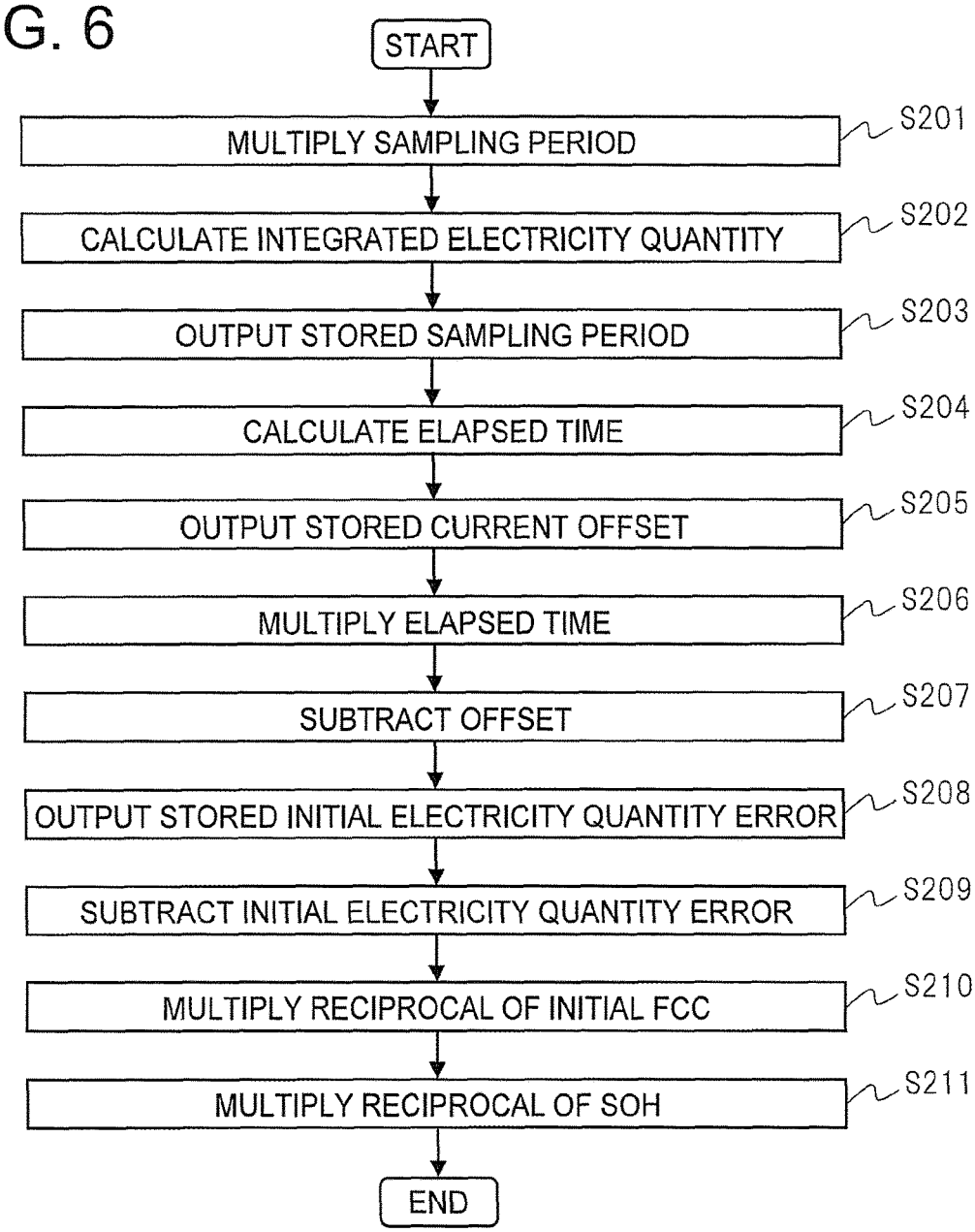
FIG. 6 is a flowchart for illustrating a series of operations to be executed by the SOC estimation unit according to the first embodiment of the present invention.
Figure 7:
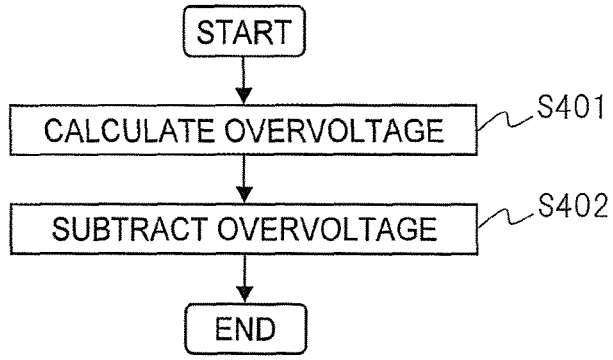
FIG. 7 is a flowchart for illustrating a series of operations to be executed by the OCV estimation unit according to the first embodiment of the present invention.

Next, with reference to flowcharts of FIG. 5 to FIG. 7, a description is given of a series of operations for estimation of the SOC of the secondary battery 101 that is executed by the battery state estimation device 100 according to the first embodiment. FIG. 5 is a flowchart for illustrating a series of operations to be executed by the battery state estimation device 100 according to the first embodiment of the present invention. FIG. 6 is a flowchart for illustrating a series of operations to be executed by the SOC estimation unit 105 according to the first embodiment of the present invention. FIG. 7 is a flowchart for illustrating a series of operations to be executed by the OCV estimation unit 106 according to the first embodiment of the present invention.

A series of Steps S102 to S112 of arithmetic processing illustrated in FIG. 5 corresponds to arithmetic processing for one period to be executed by the battery state estimation device 100, and this arithmetic processing is repeated at the sampling period $t_s$.

Further, a series of Steps S201 to S211 of arithmetic processing illustrated in FIG. 6 corresponds to arithmetic processing to be executed in Step S105 illustrated in FIG. 5. Further, a series of Steps S401 and S402 of arithmetic processing illustrated in FIG. 7 corresponds to arithmetic processing to be executed in Step S106 illustrated in FIG. 5.

In the flowcharts of FIG. 5 to FIG. 7, the number of each step corresponds to each component of the battery state estimation device 100. In other words, as described above, in the flowcharts of FIG. 5 to FIG. 7, each component of the battery state estimation device 100 executes a step having the same number as that of the component.

As illustrated in FIG. 5, the battery state estimation device 100 executes the series of Steps S102 to S112 of arithmetic processing at the sampling period $t_s$.

Further, in Step S105, the battery state estimation device 100 executes the series of Steps S201 to S211 of arithmetic processing illustrated in FIG. 6. Further, in Step S106, the battery state estimation device 100 executes the series of Steps S401 and S402 of arithmetic processing illustrated in FIG. 7.

Regarding each step of the flowcharts of FIG. 5 to FIG. 7, the order of execution by the battery state estimation device 100 is not limited to the one illustrated in each of FIG. 5 to FIG. 7, and may be changed as long as the dependency relationship among the steps is maintained.

As described above, according to the first embodiment, the battery state estimation device in the first configuration includes: the first recursive estimation unit configured to estimate and output the SOC estimation parameters; the SOC estimation unit configured to calculate and output, based on the detection current input from the current detection unit and the SOC estimation parameters input from the first recursive estimation unit, the first state of charge, and the elapsed time and integrated electricity quantity that are measured since estimation of the SOC of the secondary battery is started; the offset current subtraction unit configured to output, as the correction current, a value obtained by subtracting the offset current input from the first recursive estimation unit from the detection current input from the current detection unit; the OCV estimation unit configured to calculate and output the second open circuit voltage based on the correction current input from the offset current subtraction unit and the detection voltage input from the voltage detection unit; the OCV-SOC conversion unit configured to convert the second open circuit voltage input from the OCV estimation unit into the second state of charge for output; and the SOC subtraction unit configured to output, as the SOC error, a value obtained by subtracting the first state of charge input from the SOC estimation unit from the second state of charge input from the OCV-SOC conversion unit.

In the first configuration, the first recursive estimation unit is configured to recursively estimate and update the SOC estimation parameters based on the elapsed time and integrated electricity quantity that are input from the SOC estimation unit and the SOC error input from the SOC subtraction unit. Further, the SOC estimation unit is configured to output, as the SOC of the secondary battery, the first state of charge calculated through use of the SOC estimation parameters updated by the first recursive estimation unit.

In this manner, the SOC estimation problem is reduced to the problem of estimating parameters (namely, current offset, SOH, and initial electricity quantity error) of the current integration method, and each parameter is estimated stably and accurately. As a result, the SOC estimated with the current integration method also takes a stable and accurate value.

Therefore, it is possible to grasp the degradation degree of the secondary battery in real time based on the SOH and the resistance values of the equivalent circuit, and also to perform accurate SOC estimation by explicitly taking the current offset, the SOH, and the initial electricity quantity error, which are error factors of the current integration method, into consideration and directly removing influences thereof.

In addition to the components of the first configuration, the battery state estimation device in the second configuration further includes: the SOC-OCV conversion unit configured to convert the first state of charge input from the SOC estimation unit into the first open circuit voltage for output; the OCV subtraction unit configured to output, as the open circuit voltage error, a value obtained by subtracting the first open circuit voltage input from the SOC-OCV conversion unit from the second open circuit voltage input from the OCV estimation unit; and the second recursive estimation unit configured to estimate and output the equivalent circuit parameters.

In the second configuration, the OCV estimation unit is configured to calculate and output the second open circuit voltage and the state variable of the equivalent circuit based on the correction current input from the offset current subtraction unit, the detection voltage input from the voltage detection unit, and the equivalent circuit parameters input from the second recursive estimation unit. Further, the second recursive estimation unit is configured to recursively estimate and update the equivalent circuit parameters based on the correction current input from the offset current subtraction unit, the state variable input from the OCV estimation unit, and the open circuit voltage error input from the OCV subtraction unit. Further, the OCV estimation unit is configured to calculate the second open circuit voltage and the state variable using the equivalent circuit parameters updated by the second recursive estimation unit.

In this manner, not only parameters of the current integration method, but also parameters (namely, equivalent circuit parameters) of the OCV estimation method are recursively estimated, and thus it is possible to obtain a value with estimation, which adapts to variation in equivalent circuit parameter that depends on the temperature and degradation of the secondary battery. Therefore, the accuracy of estimating the parameters of the current integration method and the SOC improves further.

In summary, the first embodiment is configured such that the SOC estimation parameters and the equivalent circuit parameters are estimated and updated recursively based on the estimation results obtained by the SOC estimation unit and the OCV estimation unit, and each updated parameter is utilized as feedback information to correct the estimation result. As a result, it is possible to implement the battery state estimation device capable of estimating the internal state of a battery more accurately than the related art.

Second Embodiment

The battery state estimation device 100 according to a second embodiment of the present invention has a configuration different from that of the first embodiment. In the second embodiment, the description of the same points as those of the first embodiment is omitted, and points different from those of the first embodiment are mainly described.

Figure 8:
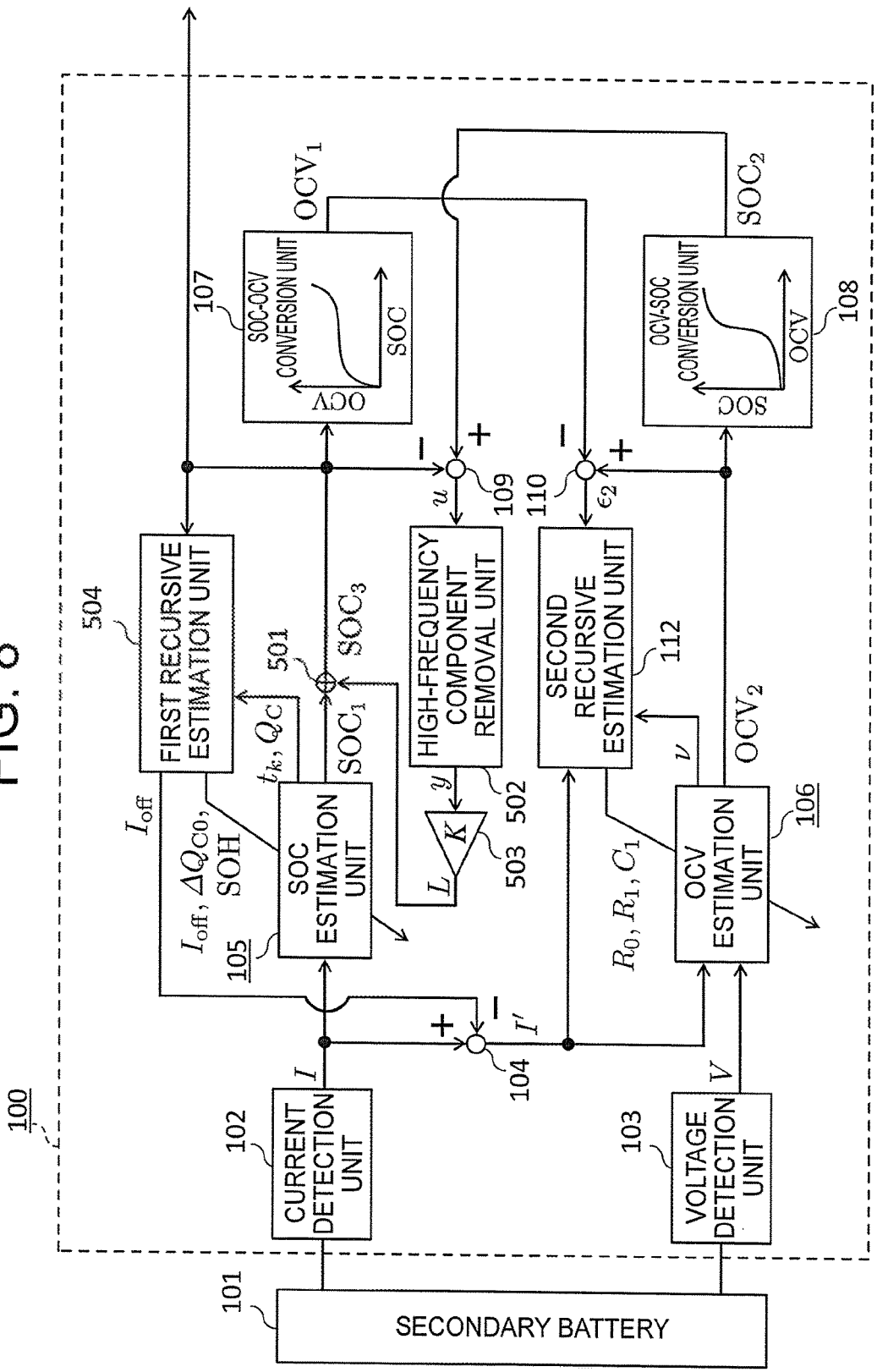
FIG. 8 is a configuration diagram for illustrating a battery state estimation device according to a second embodiment of the present invention.

FIG. 8 is a configuration diagram of the battery state estimation device 100 according to the second embodiment of the present invention. In FIG. 8, the battery state estimation device 100 includes the current detection unit 102, the voltage detection unit 103, the offset current subtraction unit 104, the SOC estimation unit 105, the OCV estimation unit 106, the SOC-OCV conversion unit 107, the OCV-SOC conversion unit 108, the SOC subtraction unit 109, the OCV subtraction unit 110, a feedback addition unit 501, a high-frequency component removal unit 502, a coefficient multiplication unit 503, a first recursive estimation unit 504, and the second recursive estimation unit 112.

The SOC estimation unit 105 is configured to calculate the first state of charge $SOC_1$, the elapsed time $t_k$, and the integrated electricity quantity $Q_C$ based on the detection current I input from the current detection unit 102 and the SOC estimation parameters input from the first recursive estimation unit 504. Further, the SOC estimation unit 105 is configured to output the calculated first state of charge $SOC_1$ to the feedback addition unit 501, and output the calculated elapsed time $t_k$ and integrated electricity quantity $Q_C$ to the first recursive estimation unit 504.

The feedback addition unit 501 is configured to execute correction value addition processing. Specifically, the feedback addition unit 501 adds an SOC correction value L input from the coefficient multiplication unit 503 to the first state of charge $SOC_1$ input from the SOC estimation unit 105, and outputs the obtained value to the first recursive estimation unit 504, the SOC-OCV conversion unit 107, and the SOC subtraction unit 109 as a third state of charge $SOC_3$.

In the second embodiment, the SOC of the secondary battery 101 estimated by the battery state estimation device 100 is the third state of charge $SOC_3$ output from the feedback addition unit 501. In other words, the third state of charge $SOC_3$ is output as a final result of estimation of the SOC of the secondary battery 101 by the battery state estimation device 100.

The SOC-OCV conversion unit 107 is configured to convert the third state of charge $SOC_3$ input from the feedback addition unit 501 into the first open circuit voltage $OCV_1$, and output the converted first open circuit voltage $OCV_1$ to the OCV subtraction unit 110.

The SOC subtraction unit 109 is configured to subtract the third state of charge $SOC_3$ input from the feedback addition unit 501 from the second state of charge $SOC_2$ input from the OCV-SOC conversion unit 108, and output the obtained value to the high-frequency component removal unit 502 as an SOC error u.

The high-frequency component removal unit 502 is configured to execute high-frequency component removal processing. Specifically, the high-frequency component removal unit 502 removes high-frequency components from the SOC error u input from the SOC subtraction unit 109, and outputs the SOC error y obtained through removal to the coefficient multiplication unit 503.

As the high-frequency component removal unit 502, for example, an exponential moving average filter or an integrator with a forgetting coefficient may be used.

As the low-pass filter, for example, a filter having a filter characteristic shown by Expression (16) given below may be used.

$$y(k)=w_1 y(k-1)+w_2 u(k) \tag{16}$$

In Expression (16), $w_1$ and $w_2$ are forgetting coefficients set in advance. The conditions of $0<w_1<1$ and $w_2=1-w_1$ result in an exponential moving average filter, the condition of $0<w_1=w_2<1$ results in an integrator with a forgetting coefficient, and the condition of $w_2=w_2=1$ results in a general integrator. The forgetting coefficient has a characteristic in that, as $w_1$ becomes larger, u in the past becomes less likely to be forgotten.

The SOC error u is susceptible to an influence of a voltage measurement error of the first state of charge $SOC_1$, and influences of an equivalent circuit model error and an equivalent circuit parameter estimation error. The former error is an error with an average of 0, whereas the latter errors depend on the current value and the estimation accuracy, and those errors appear as outliers especially when a steep high current flows. Thus, the forgetting coefficient is set such that the former influence is smoothed and the latter influences are removed.

For example, when T is set to obtain $w_1=\exp(-t_s/T)$ as the forgetting coefficient, the value of T is desired to be set to the value of at least $10 \times t_s$ or more (that is, T is ten times or more of the sampling period $t_s$) so that the error of the OCV estimation method can be reduced sufficiently.

The coefficient multiplication unit 503 is configured to execute gain multiplication processing. Specifically, the coefficient multiplication unit 503 multiplies the SOC error y input from the high-frequency component removal unit 502 by a gain K, and outputs the obtained value to the feedback addition unit 501 as the SOC correction value L.

The first recursive estimation unit 504 is configured to execute recursive estimation processing for current integration correction. Specifically, the first recursive estimation unit 504 calculates the estimation values of the SOC estimation parameters based on the elapsed time $t_k$ and the integrated electricity quantity $Q_C$ that are input from the SOC estimation unit 105, and the third state of charge $SOC_3$ input from the feedback addition unit 501. Further, the first recursive estimation unit 504 outputs the calculated SOC estimation parameters to the SOC estimation unit 105, and outputs only the offset current $I_{off}$ to the offset current subtraction unit 104 among the calculated SOC estimation parameters.

The offset current subtraction unit 104 subtracts the offset current $I_{off}$ input from the first recursive estimation unit 504 from the detection current I input from the current detection unit 102, and outputs the obtained value to the OCV estimation unit 106 and the second recursive estimation unit 112 as the correction current I'.

The first recursive estimation unit 504 can construct RLS with the third state of charge $SOC_3$ being a teaching signal by setting $\varepsilon_1(k)=SOC_3(k)-\varphi_1^T(k)\theta_1(k-1)$. Similarly to the first embodiment, the second state of charge $SOC_2$ can be used as the teaching signal by inputting the second state of charge $SOC_2$ into the first recursive estimation unit 504 instead of the third state of charge $SOC_3$.

Next, a description is given of the third state of charge $SOC_3$ output from the feedback addition unit 501 in more detail. The battery state estimation device 100 according to the second embodiment calculates the third state of charge $SOC_3$ in accordance with Expression (17) given below.

$$SOC_3(k) = SOC_1(k) + L(k-1) \quad (17)$$
$$= \frac{1}{FCC_0 \cdot SOH(k-1)}\left(\begin{array}{c} Q_C(k) - t_k I_{off}(k-1) - \\ \Delta Q_{C0}(k-1) \end{array}\right) + L(k-1)$$

In Expression (17), even when the SOC correction value L serving as a feedback correction term is omitted, it is possible to accurately estimate the SOC as long as the first recursive estimation unit 504 estimates the SOC estimation parameters correctly.

However, in actuality, the first recursive estimation unit 504 does not always acquire correct estimation values. For example, it is problematic that, when an initial value of the estimation value is different from a true value and a substantial amount of time is necessary for the initial value to converge to the true value, an accurate estimation value of the SOC cannot be acquired during that period.

Expression (17) has an advantage in that, even in such cases, the first state of charge $SOC_1$ is corrected by the SOC correction value L, and as a result, the third state of charge $SOC_3$ can be caused to converge to a value close to the true SOC rapidly.

Further, the value of the SOC correction value L to be fed back is determined based on the error between the third state of charge $SOC_3$ and the second state of charge $SOC_2$ that is calculated by using the OCV estimation method, which is hardly influenced by the current offset error, the SOH error, and the initial electricity quantity error. Therefore, the third state of charge $SOC_3$ follows the second state of charge $SOC_2$ in a mid and long term.

Further, the value of the SOC correction value L is obtained after the passage through the high-frequency component removal unit 502, and thus the third state of charge $SOC_3$ follows the change in SOC of the first state of charge $SOC_1$ in a short term.

The second state of charge $SOC_2$ is a value calculated based on the OCV estimation method, which does not involve integration of an error, and thus is accurate in a mid and long term. On the other hand, the first state of charge $SOC_1$ is directly calculated using the current integration method, and thus can accurately follow the short-term change of the SOC.

In conclusion, the third state of charge $SOC_3$ can be said to be an accurate estimation value that achieves both advantages of the current integration method and the OCV estimation method.

Figure 9:
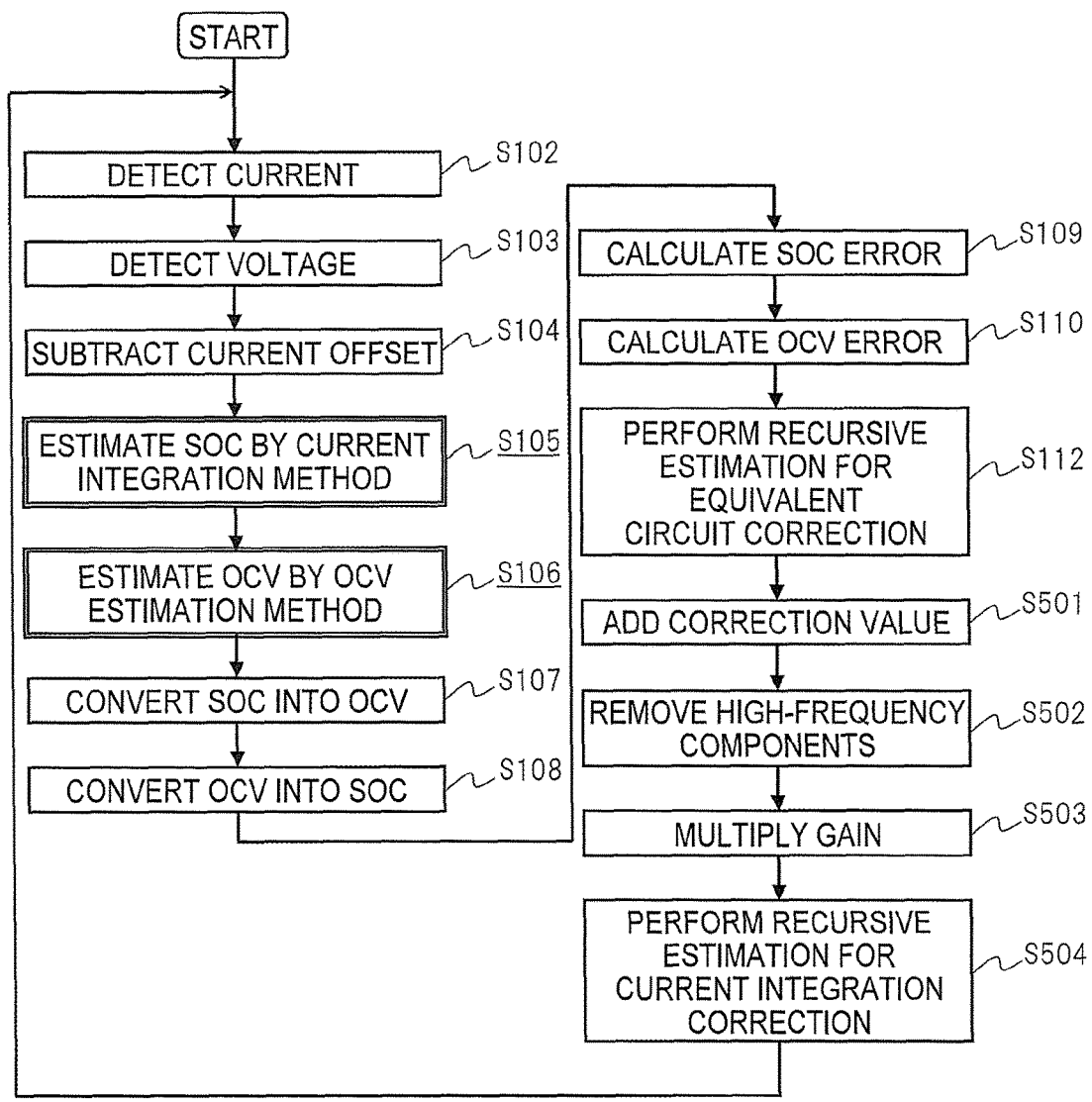
FIG. 9 is a flowchart for illustrating a series of operations to be executed by the battery state estimation device according to the second embodiment of the present invention.

Next, a description is given of a series of operations for estimation of the SOC of the secondary battery 101 that is executed by the battery state estimation device 100 according to the second embodiment with reference to FIG. 9. FIG. 9 is a flowchart for illustrating a series of operations to be executed by the battery state estimation device 100 according to the second embodiment of the present invention.

A series of Steps S102 to S112 and Steps S501 to S504 of arithmetic processing illustrated in FIG. 9 corresponds to arithmetic processing for one period to be executed by the battery state estimation device 100 according to the second embodiment, and this arithmetic processing is repeated at the sampling period $t_s$.

In the flowchart of FIG. 9, the number of each step corresponds to each component of the battery state estimation device 100 according to the second embodiment. In other words, as described above, in the flowchart of FIG. 9, each component of the battery state estimation device 100 executes a step having the same number as that of the component.

As illustrated in FIG. 9, the battery state estimation device 100 executes the series of Steps S102 to S112 and Steps S501 to S504 of arithmetic processing at the sampling period $t_s$.

Regarding each step of the flowchart of FIG. 9, the order of execution by the battery state estimation device 100 is not limited to the one illustrated in FIG. 9, and may be changed as long as the dependency relationship among the steps is maintained.

In the second embodiment, there is exemplified a case in which the first recursive estimation unit 504 uses the third state of charge $SOC_3$ input from the feedback addition unit 501 to recursively estimate and update the SOC estimation parameters. However, as described above, the second state of charge $SOC_2$ can be used as the teaching signal by inputting the second state of charge $SOC_2$ into the first recursive estimation unit 504 instead of the third state of charge $SOC_3$. In other words, as a modification example, the first recursive estimation unit 504 may be configured to receive input of the second state of charge $SOC_2$ from the OCV-SOC conversion unit 108, and use the input second state of charge $SOC_2$ to recursively estimate and update the SOC estimation parameters.

Further, in the second embodiment, there is exemplified a case in which the SOC of the secondary battery 101 estimated by the battery state estimation device 100 is the third state of charge $SOC_3$ output from the feedback addition unit 501. However, the SOC of the secondary battery 101 may be the first state of charge $SOC_1$ output from the first recursive estimation unit 504.

As described above, according to the second embodiment, the battery state estimation device in the first configuration includes: the first recursive estimation unit configured to estimate and output the SOC estimation parameters; the SOC estimation unit configured to calculate and output, based on the detection current input from the current detection unit and the SOC estimation parameters input from the first recursive estimation unit, the first state of charge, and the elapsed time and integrated electricity quantity that are measured since estimation of the SOC of the secondary battery is started; the offset current subtraction unit configured to output, as the correction current, a value obtained by subtracting the offset current input from the first recursive estimation unit from the detection current input from the current detection unit; the OCV estimation unit configured to calculate and output the second open circuit voltage based on the correction current input from the offset current subtraction unit and the detection voltage input from the voltage detection unit; the OCV-SOC conversion unit configured to convert the second open circuit voltage input from the OCV estimation unit into the second state of charge for output; the feedback addition unit configured to output, as the third state of charge, a value obtained by adding an input SOC correction value to the first state of charge input from the SOC estimation unit; the SOC subtraction unit configured to output, as the SOC error, a value obtained by subtracting the third state of charge input from the feedback addition unit from the second state of charge input from the OCV-SOC conversion unit; the high-frequency component removal unit configured to output a value obtained by removing high-frequency components from the SOC error input from the SOC subtraction unit; and the coefficient multiplication unit configured to output, as the SOC correction value, a value obtained by multiplying the output value of the high-frequency component removal unit by a gain.

In the first configuration, the first recursive estimation unit is configured to recursively estimate and update the SOC estimation parameters based on the elapsed time and integrated electricity quantity that are input from the SOC estimation unit, and the third state of charge input from the feedback addition unit or the first state of charge input from the SOC estimation unit. Further, the SOC estimation unit is configured to calculate the first state of charge, the elapsed time, and the integrated electricity quantity through use of the SOC estimation parameters updated by the first recursive estimation unit.

In this manner, the battery state estimation device includes a feedback system, and thus can estimate the SOC accurately using the third state of charge without waiting for the SOC estimation parameter of the current integration method to converge to a value close to the true value.

In summary, a difference between the second state of charge estimated based on the OCV estimation method and the first state of charge estimated based on the current integration method is taken and caused to pass through the high-frequency component removal unit, to thereby remove outlier values caused by high-frequency components due to the voltage measurement error and the equivalent circuit model error, which are contained in the second state of charge. As a result, a reliable error between the first state of charge and the second state of charge in the low and medium frequency area is obtained with the OCV estimation method. Then, the error value is multiplied by a gain and fed back to correct the first state of charge, to thereby finally output the third state of charge. The third state of charge can follow the short-term change of the SOC of the current integration method, which is reliable in a short term, and at the same time, follow the mid-and-long term change of the SOC of the OCV estimation method, which is reliable in a mid and long term.

Therefore, it is possible to estimate the SOC accurately by removing through feedback the error of SOC estimation performed with the current integration method.

Further, similarly to the first embodiment, parameters of the current integration method are recursively estimated, and thus as each estimation parameter converges to the true value, the estimation accuracy for the first state of charge improves to surpass the estimation accuracy for the third state of charge. Therefore, it is possible to estimate the SOC highly accurately, and acquire in real time an accurate SOH estimation value from which the influence of the current offset error is removed.

In addition to the components of the first configuration, the battery state estimation device in the second configuration further includes: the SOC-OCV conversion unit configured to convert the third state of charge input from the feedback addition unit into the first open circuit voltage for output; the OCV subtraction unit configured to output, as the open circuit voltage error, a value obtained by subtracting the first open circuit voltage input from the SOC-OCV conversion unit from the second open circuit voltage input from the OCV estimation unit; and the second recursive estimation unit configured to estimate and output the equivalent circuit parameters.

In the second configuration, the OCV estimation unit is configured to calculate and output the second open circuit voltage and the state variable of the equivalent circuit based on the correction current input from the offset current subtraction unit, the detection voltage input from the voltage detection unit, and the equivalent circuit parameters input from the second recursive estimation unit. Further, the second recursive estimation unit is configured to recursively estimate and update the equivalent circuit parameters based on the correction current input from the offset current subtraction unit, the state variable input from the OCV estimation unit, and the open circuit voltage error input from the OCV subtraction unit. Further, the OCV estimation unit is configured to calculate the second open circuit voltage and the state variable using the equivalent circuit parameters updated by the second recursive estimation unit.

In this manner, not only parameters of the current integration method, but also parameters (namely, equivalent circuit parameters) of the OCV estimation method are recursively estimated, and thus it is possible to obtain a value with estimation, which adapts to variation in equivalent circuit parameter that depends on the temperature and degradation of the secondary battery. Therefore, the accuracy of estimating the parameters of the current integration method and the SOC improves further.

In summary, the second embodiment is configured such that the SOC correction value is recursively estimated and updated based on the estimation results obtained by the SOC estimation unit and the OCV estimation unit, and each updated SOC correction value is utilized as feedback information to correct the estimation result. As a result, it is possible to implement the battery state estimation device capable of estimating the internal state of a battery more accurately than the related art.

Further, similarly to the first embodiment, it is possible to further improve the estimation accuracy by further incorporating the configuration in which the SOC estimation parameters and the equivalent circuit parameters are recursively estimated and updated based on the estimation results obtained by the SOC estimation unit and the OCV estimation unit, and each updated parameter is utilized as feedback information to correct the estimation result.

Third Embodiment

The battery state estimation device 100 according to a third embodiment of the present invention has a configuration different from those of the first and second embodiments. In the third embodiment, the description of the same points as those of the first and second embodiments is omitted, and points different from those of the first and second embodiments are mainly described.

Figure 10:
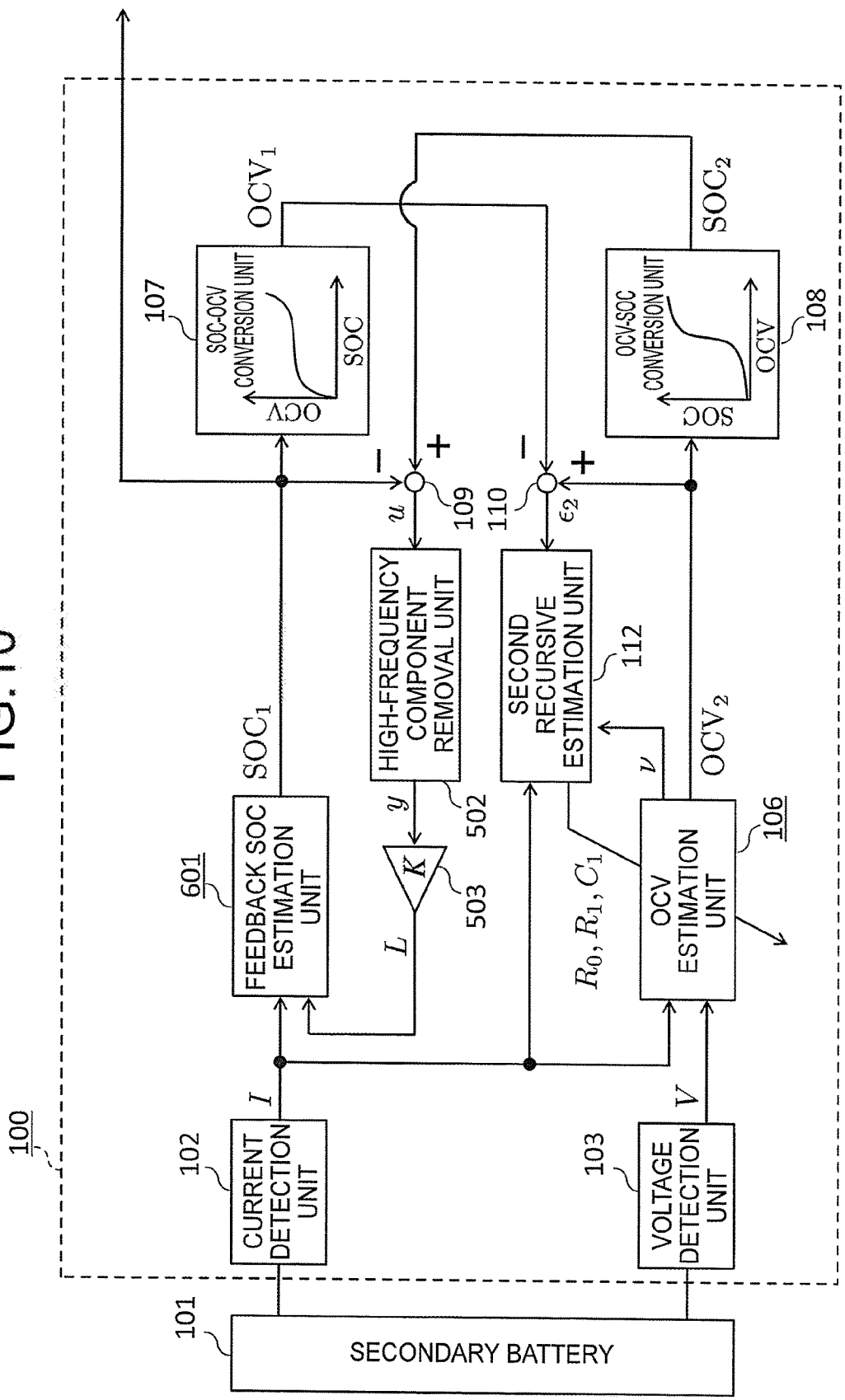
FIG. 10 is a configuration diagram of a battery state estimation device according to a third embodiment of the present invention.

FIG. 10 is a configuration diagram of the battery state estimation device 100 according to the third embodiment of the present invention. In FIG. 10, the battery state estimation device 100 includes the current detection unit 102, the voltage detection unit 103, a feedback SOC estimation unit 601, the OCV estimation unit 106, the SOC-OCV conversion unit 107, the OCV-SOC conversion unit 108, the SOC subtraction unit 109, the OCV subtraction unit 110, the high-frequency component removal unit 502, the coefficient multiplication unit 503, and the second recursive estimation unit 112.

The feedback SOC estimation unit 601 is configured to calculate the first state of charge $SOC_1$ based on the detection current I input from the current detection unit 102 and the SOC correction value L input from the coefficient multiplication unit 503, and output the first state of charge $SOC_1$ to the SOC-OCV conversion unit 107 and the SOC subtraction unit 109.

The feedback SOC estimation unit 601 adds the SOC correction value L to the value obtained with the general current integration method represented by Expression (1) to estimate the SOC. In other words, the feedback SOC estimation unit 601 calculates the first state of charge $SOC_1$ in accordance with Expression (18) given below.

$$SOC_1(k) = SOC_1(k-1) + \frac{t_s}{FCC}I(k-1) + L(k-1) \quad (18)$$

In the third embodiment, as can be understood from the expression given above, the error model of the current integration method as represented by Expression (5) is not assumed, and the SOC calculated with the current integration method is corrected only with the SOC correction value L. The full charge capacity FCC, the offset current $I_{off}$, and the initial SOC error $\Delta SOC_{ini}$, which are major error factors of the current integration method, are all low frequency errors. Therefore, it is possible to accurately estimate the SOC only with feedback correction without directly estimating those low frequency errors.

Figure 11:
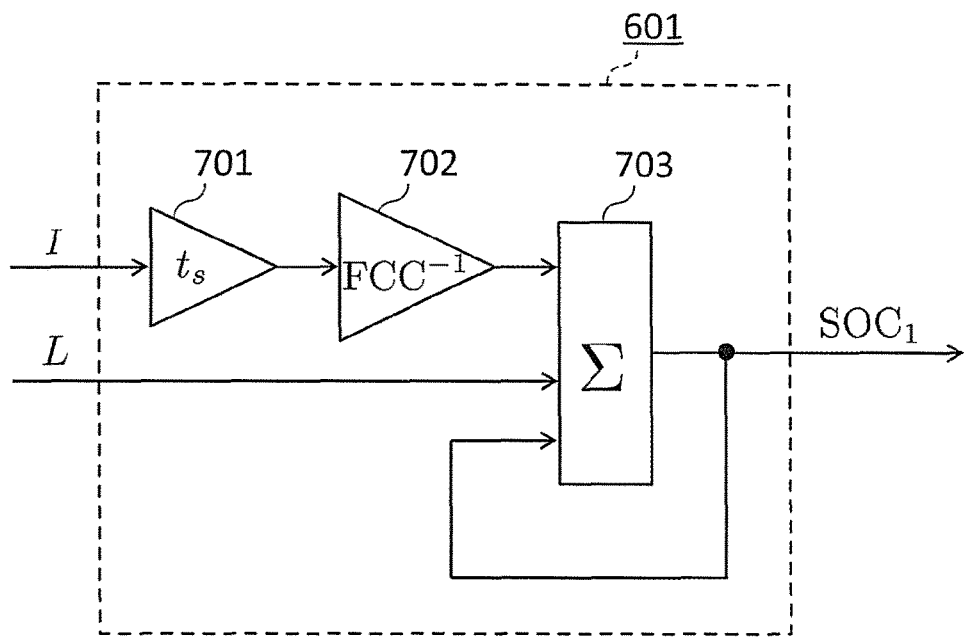
FIG. 11 is a configuration diagram of a feedback SOC estimation unit according to the third embodiment of the present invention.

Next, a description is given of a specific configuration of the feedback SOC estimation unit 601 with reference to FIG. 11. FIG. 11 is a configuration diagram of the feedback SOC estimation unit 601 according to the third embodiment of the present invention.

In FIG. 11, the feedback SOC estimation unit 601 includes a coefficient multiplier 701, a coefficient multiplier 702, and a summator 703.

The coefficient multiplier 701 is configured to execute sampling period multiplication processing. Specifically, the coefficient multiplier 701 multiplies the detection current I input from the current detection unit 102 by the sampling period $t_s$, and outputs the obtained value to the coefficient multiplier 702.

The coefficient multiplier 702 is configured to execute FCC reciprocal multiplication processing. Specifically, the coefficient multiplier 702 multiplies the output value of the coefficient multiplier 701 by the reciprocal of the full charge capacity FCC, and outputs the obtained value to the summator 703. When an accurate value of the full charge capacity FCC is not known, for example, the value of the initial full charge capacity $FCC_0$ or other values may be used.

The summator 703 is configured to execute sum calculation processing. Specifically, the summator 703 adds all of the output of the coefficient multiplier 702, the SOC correction value L, and the output of the summator 703 that was obtained one sampling period before, and outputs the obtained value as the first state of charge $SOC_1$. The first state of charge $SOC_1$, which was obtained at the end of the previous SOC estimation, may be used as the value of $SOC_1(0)$.

In other cases, when a long period of time has elapsed since the end of the previous SOC estimation, the detection voltage V detected by the voltage detection unit 103 may be considered as the open circuit voltage of the secondary battery 101, and the value obtained by converting the open circuit voltage into the SOC using OCV-SOC conversion unit 108 can be used as the value of $SOC_1(0)$.

Through configuration of the feedback SOC estimation unit 601 in this manner, the feedback SOC estimation unit 601 can execute calculation of Expression (18).

Figure 12:
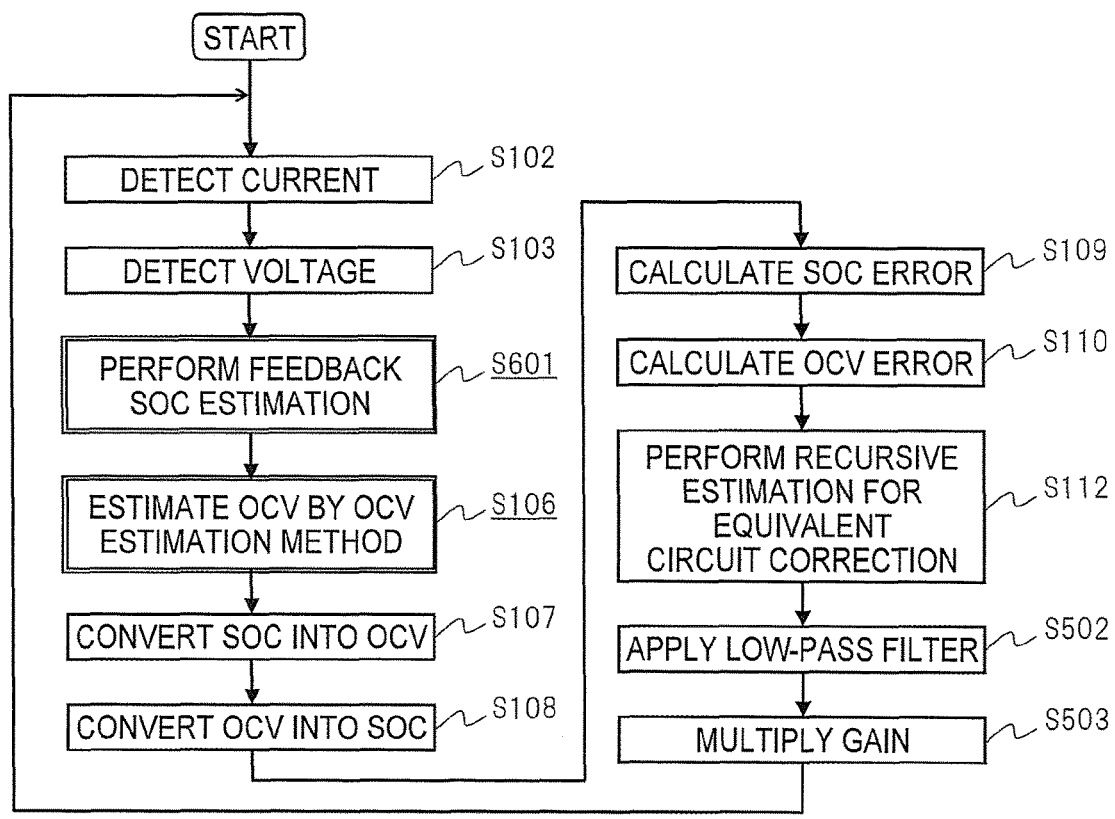
FIG. 12 is a flowchart for illustrating a series of operations to be executed by the battery state estimation device according to the third embodiment of the present invention.
Figure 13:
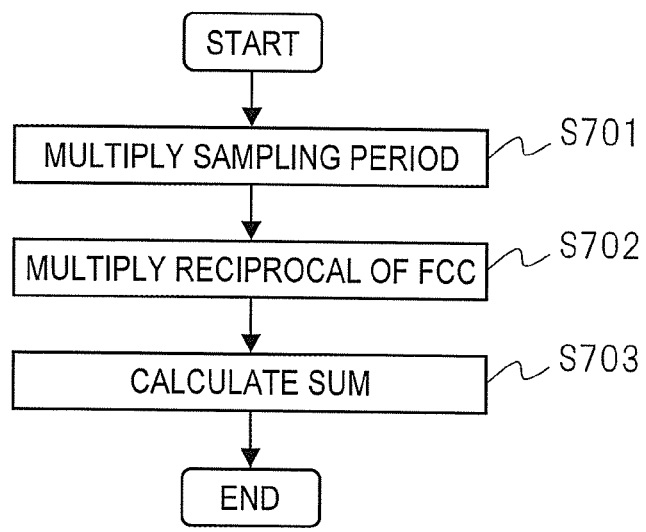
FIG. 13 is a flowchart for illustrating a series of operations to be executed by the feedback SOC estimation unit according to the third embodiment of the present invention.

Next, with reference to flowcharts of FIG. 12 and FIG. 13, a description is given of a series of operations for estimation of the SOC of the secondary battery 101 that is executed by the battery state estimation device 100 according to the third embodiment. FIG. 12 is a flowchart for illustrating a series of operations to be executed by the battery state estimation device 100 according to the third embodiment of the present invention. FIG. 13 is a flowchart for illustrating a series of operations to be executed by the feedback SOC estimation unit 601 according to the third embodiment of the present invention.

A series of Steps S102 and S103, Step 601, Steps S106 to S110, Step S112, and Steps S502 and S503 of arithmetic processing illustrated in FIG. 12 corresponds to arithmetic processing for one period to be executed by the battery state estimation device 100 according to the third embodiment, and this arithmetic processing is repeated at the sampling period $t_s$.

Further, a series of Steps S701 to S703 of arithmetic processing illustrated in FIG. 13 corresponds to arithmetic processing to be executed in Step S601 illustrated in FIG. 12.

In the flowcharts of FIG. 12 and FIG. 13, the number of each step corresponds to each component of the battery state estimation device 100 according to the third embodiment. In other words, as described above, in the flowcharts of FIG. 12 and FIG. 13, each component of the battery state estimation device 100 executes a step having the same number as that of the component.

As illustrated in FIG. 12, the battery state estimation device 100 executes the series of Steps S102 and S103, Step 601, Steps S106 to S110, Step S112, and Steps S502 and S503 of arithmetic processing at the sampling period $t_s$.

Further, in Step S601, the battery state estimation device 100 executes the series of Steps S701 to S703 of arithmetic processing illustrated in FIG. 13.

Regarding each step of the flowcharts of FIG. 12 and FIG. 13, the order of execution by the battery state estimation device 100 is not limited to the one illustrated in each of FIG. 12 and FIG. 13, and may be changed as long as the dependency relationship among the steps is maintained.

As described above, according to the third embodiment, the battery state estimation device in the first configuration includes: the feedback SOC estimation unit configured to calculate the first state of charge based on the detection current input from the current detection unit and the SOC correction value for correcting the SOC of the secondary battery for output; the OCV estimation unit configured to calculate the second open circuit voltage based on the detection current input from the current detection unit and the detection voltage input from the voltage detection unit for output; the OCV-SOC conversion unit configured to convert the second open circuit voltage input from the OCV estimation unit into the second state of charge for output; the SOC subtraction unit configured to output, as the SOC error, a value obtained by subtracting the first state of charge input from the feedback SOC estimation unit from the second state of charge input from the OCV-SOC conversion unit; the high-frequency component removal unit configured to output a value obtained by removing high-frequency components from the SOC error input from the SOC subtraction unit; and the coefficient multiplication unit configured to output, as the SOC correction value, a value obtained by multiplying the output value of the high-frequency component removal unit by the gain.

In this manner, the battery state estimation device includes a feedback system, and thus can estimate the SOC accurately by correcting influences of errors of the FCC, the current offset, and the initial SOC, which are error factors of the current integration method.

In summary, the low and medium frequency components of the error between the first state of charge that is based on the current integration method and the second state of charge that is estimated based on the OCV estimation method are fed back to calculate the first state of charge so that the obtained SOC estimation value follows the state of charge $SOC_2$ of the OCV estimation method, which is reliable in the low and medium frequency area, and follows the SOC estimation value of the current integration method, which is reliable in the high-frequency area. Through provision of the high-frequency component removal unit in the feedback system, it is possible to remove, from the error between $SOC_2$ and $SOC_1$, high-frequency components due to the voltage measurement error and the equivalent circuit model error of the OCV estimation method.

Therefore, despite the simple system in which the recursive estimation unit is not provided to implement the current integration method, the feedback correction effect allows the SOC to converge to a value close to the true value in a short amount of time even when the current integration method has the initial SOC error, and also reduces influences due to the current offset error and the FCC error, to thereby achieve stable and accurate calculation of the SOC estimation value.

Further, in the third embodiment, unlike the second embodiment, the SOC correction value L is not used to correct the first state of charge $SOC_1$ and calculate the third state of charge $SOC_3$, but used to directly calculate the first state of charge $SOC_1$ as represented by Expression (18). With this, it is possible to prevent a phenomenon in which the $SOC_1$, the error between the $SOC_2$ and the $SOC_1$, and the SOC correction value L increase or decrease unlimitedly because of the influence of the current offset error.

In addition to the components of the first configuration, the battery state estimation device in the second configuration further includes: the OCV subtraction unit configured to output, as the open circuit voltage error, a value obtained by subtracting the first open circuit voltage input from the SOC-OCV conversion unit from the second open circuit voltage input from the OCV estimation unit; and the second recursive estimation unit configured to estimate and output the equivalent circuit parameters.

In the second configuration, the OCV estimation unit is configured to calculate and output the second open circuit voltage and the state variable of the equivalent circuit based on the detection current input from the current detection unit, the detection voltage input from the voltage detection unit, and the equivalent circuit parameters input from the second recursive estimation unit. Further, the second recursive estimation unit is configured to recursively estimate and update the equivalent circuit parameters based on the detection current input from the current detection unit, the state variable input from the OCV estimation unit, and the open circuit voltage error input from the OCV subtraction unit. Further, the OCV estimation unit is configured to calculate the second open circuit voltage and the state variable using the equivalent circuit parameters updated by the second recursive estimation unit.

In this manner, parameters (namely, equivalent circuit parameters) of the OCV estimation method are recursively estimated. Therefore, it is possible to obtain a value with estimation, which adapts to variation in equivalent circuit parameter that depends on the temperature and degradation of the secondary battery. As a result, the accuracy of estimating the SOC by the OCV estimation method improves, and the accuracy of estimating the SOC calculated by the feedback SOC estimation unit referring to the SOC also improves.

In summary, in the third embodiment, the characteristics of the OCV estimation method in which the OCV estimation method does not involve accumulation of errors and has a relatively small error with respect to the true value of the SOC on a time-average basis is utilized as feedback information to correct the error of the current integration method. With this, it is possible to implement the battery state estimation device capable of estimating the battery internal state more accurately than the related art although the battery state estimation device has a simple system that does not include components for estimating the error factors of the current integration method like the first recursive estimation unit in the first and second embodiments.

Further, similarly to the first and second embodiments, it is possible to further improve the estimation accuracy by further incorporating the configuration in which the equivalent circuit parameters are recursively estimated and updated based on the estimation results obtained by the feedback SOC estimation unit and the OCV estimation unit, and each updated parameter is utilized as feedback information to correct the estimation result.

The invention claimed is:

1. A battery state estimation device, which is configured to estimate at least a state of charge of a secondary battery as an estimated state of charge, the battery state estimation device comprising circuitry configured to perform:
   current detection, for detecting one of a charge current and a discharge current of the secondary battery as a detection current;
   voltage detection, for detecting a voltage between terminals of the secondary battery as a detection voltage;
   first recursive estimation, for estimating state-of-charge estimation parameters comprising a state of health of the secondary battery and an offset current of the current detection;
   state of charge (SOC) calculating, for calculating at least a first state of charge based on the detection current and the state-of-charge estimation parameters;
   SOC-OCV conversion, for converting the first state of charge into a first open circuit voltage;
   second recursive estimation, for estimating open circuit voltage (OCV) estimation parameters comprising equivalent circuit parameters;
   OCV estimation, for calculating, based on the detection current, the detection voltage, and the OCV estimation parameters, a second open circuit voltage and a state variable of an equivalent circuit corresponding to the OCV estimation parameters;
   OCV-SOC conversion, for converting the second open circuit voltage into a second state of charge;
   OCV subtraction, for outputting, as an open circuit voltage error, a value obtained by subtracting the first open circuit voltage from the second open circuit voltage; and
   SOC subtraction, for outputting, as a state-of-charge error, a value obtained by subtracting the first state of charge from the second state of charge, wherein
   the first recursive estimation recursively estimates and updates the state-of-charge estimation parameters at least based on the state-of-charge error, wherein
   the second recursive estimation recursively estimates and updates the OCV estimation parameters at least based on the open circuit voltage error, and wherein
   the battery state estimation device is configured to determine the first state of charge as the estimated state of charge.

2. The battery state estimation device according to claim 1, the circuitry further configured to perform offset current subtraction by outputting, as a correction current, a value obtained by subtracting the offset current from the detection current, wherein
   the OCV estimation calculates, based on the correction current the detection voltage, and the OCV estimation parameters, the second open circuit voltage and the state variable of an equivalent circuit corresponding to the OCV estimation parameters, wherein
   the second recursive estimation recursively estimates and updates the OCV estimation parameters based on the correction current, the state variable, and the open circuit voltage error.

3. The battery state estimation device according to claim 2, wherein the first recursive estimation estimates the state-of-charge estimation parameters comprising: the state of health or a full charge capacity of the secondary battery; and the offset current, wherein
   the SOC estimation calculates elapsed time since estimation of the state of charge of the second battery is started, an integrated electricity quantity measured since the estimation of the state of charge of the second battery is started, and the first state of charge based on the detection current and the state-of-charge estimation parameters, and wherein
   the first recursive estimation recursively estimates and updates the state-of-charge estimation parameters based on the state-of-charge error and the elapsed time and the integrated electricity quantity.

4. The battery state estimation device according to claim 1, the circuitry further configured to perform:
   feedback addition, for correcting the first state of charge to output the corrected first state of charge as a third state of charge;
   high-frequency component removal, for outputting a value obtained by removing high-frequency components from the state-of-charge error; and
   coefficient multiplication, for outputting, as a state-of-charge correction value, a value obtained by multiplying an output value of the high-frequency component removal by a gain, wherein
   the feedback addition outputs, as the third state of charge, a value obtained by adding the first state of charge and the state-of-charge correction value, wherein
   the SOC-OCV conversion converts the third state of charge instead of the first state of charge into the first open circuit voltage, wherein
   the SOC subtraction outputs, as the state-of-charge error, a value obtained by subtracting the third state of charge instead of the first state of charge from the second state of charge, wherein
   the first recursive estimation recursively estimates and updates the state-of-charge estimation parameters at least based on the third state of charge or the second state of charge, which serves as a substitute for the state-of-charge error, and wherein
   the battery state estimation device is configured to determine the first state of charge or the third state of charge as the estimated state of charge.

5. The battery state estimation device according to claim 4, the circuitry further configured to perform: offset current subtraction, for outputting, as a correction current, a value obtained by subtracting the offset current from the detection current, wherein
   the OCV estimation calculates, based on the correction current, the detection voltage, and the OCV estimation parameters, the second open circuit voltage and the state variable of an equivalent circuit corresponding to the OCV estimation parameters, wherein
   the second recursive estimation recursively estimates and updates the OCV estimation parameters based on the correction current, the state variable, and the open circuit voltage error, the state variable output.

6. The battery state estimation device according to claim 5, wherein
   the first recursive estimation estimates the state-of-charge estimation parameters comprising: the state of health or a full charge capacity of the secondary battery; and the offset current, wherein
   the SOC estimation calculates elapsed time since estimation of the state of charge of the second battery is started, an integrated electricity quantity measured since the estimation of the state of charge of the second battery is started, and the first state of charge based on the detection current and the state-of-charge estimation parameters, and wherein the first recursive estimation recursively estimates and updates the state-of-charge estimation parameters based on the third state of charge or the second state of charge, which serves as a substitute for the state-of-charge error, and on the elapsed time and the integrated electricity quantity.

7. A battery state estimation device, which is configured to estimate at least a state of charge of a secondary battery as an estimated state of charge, the battery state estimation device comprising circuitry configured to perform:

current detection, for detecting one of a charge current and a discharge current of the secondary battery as a detection current;

voltage detection, for detecting a voltage between terminals of the secondary battery as a detection voltage;

coefficient multiplication, for calculating a state-of-charge correction value;

feedback state of charge (SOC) estimation, for calculating a first state of charge at least based on the detection current and the state-of-charge correction value;

SOC-OCV conversion, for converting the first state of charge into a first open circuit voltage;

second recursive estimation, for estimating open circuit voltage (OCV) estimation parameters comprising equivalent circuit parameters;

OCV estimation, for estimating at least a second open circuit voltage based on the detection current, the detection voltage, and the OCV estimation parameters;

OCV-SOC conversion, for converting the second open circuit voltage into a second state of charge;

OCV subtraction, for outputting, as an open circuit voltage error, a value obtained by subtracting the first open circuit voltage from the second open circuit voltage;

SOC subtraction, for outputting, as a state-of-charge error, a value obtained by subtracting the first state of charge from the second state of charge; and high-frequency component removal, for outputting a value obtained by removing high-frequency components from the state-of-charge error, wherein the coefficient multiplication outputs, as the state-of-charge correction value, a value obtained by multiplying an output value of the high-frequency component removal by a gain, wherein the second recursive estimation recursively estimates and updates the OCV estimation parameters at least based on the open circuit voltage error, and wherein the battery state estimation device is configured to determine the first state of charge as the estimated state of charge.

8. The battery state estimation device according to claim 7, wherein the OCV estimation calculates, based on the detection current, the detection voltage, and the OCV estimation parameters, the second open circuit voltage and a state variable of an equivalent circuit corresponding to the OCV estimation parameters, wherein the second recursive estimation recursively estimates and updates the OCV estimation parameters based on the detection current, the state variable, and the open circuit voltage error.

* * * * *